United States Patent
Su

(10) Patent No.: US 9,449,710 B2
(45) Date of Patent: Sep. 20, 2016

(54) DECODING AND SCAN DRIVER

(71) Applicant: SITRONIX TECHNOLOGY CORP., Hsinchu County (TW)

(72) Inventor: Chung-Hsin Su, Hsinchu County (TW)

(73) Assignee: Sitronix Technology Corp., Hsinchu County (TW)

( * ) Notice: Subject to any disclaimer, the term of this patent is extended or adjusted under 35 U.S.C. 154(b) by 444 days.

(21) Appl. No.: 13/760,231

(22) Filed: Feb. 6, 2013

(65) Prior Publication Data

US 2014/0118234 A1 May 1, 2014

(30) Foreign Application Priority Data

Oct. 31, 2012 (TW) ............................. 101140235 A

(51) Int. Cl.
*G11C 19/28* (2006.01)
*G09G 3/36* (2006.01)

(52) U.S. Cl.
CPC ............. *G11C 19/28* (2013.01); *G09G 3/3674* (2013.01); *G09G 2310/0286* (2013.01); *G09G 2310/0289* (2013.01)

(58) Field of Classification Search
CPC .................... G09G 3/3674; G09G 2310/0286
USPC .................. 345/87–100; 326/62–63, 80, 105
See application file for complete search history.

(56) References Cited

U.S. PATENT DOCUMENTS

| 7,847,781 B2 | 12/2010 | Lai | |
|---|---|---|---|
| 2005/0057481 A1* | 3/2005 | Chung | 345/100 |
| 2007/0103346 A1* | 5/2007 | Liu | 341/50 |
| 2008/0266220 A1* | 10/2008 | Wang et al. | 345/87 |
| 2009/0164859 A1 | 6/2009 | Liu et al. | |
| 2009/0276668 A1* | 11/2009 | Hung | 714/726 |
| 2010/0007643 A1* | 1/2010 | Wu et al. | 345/211 |
| 2011/0210955 A1* | 9/2011 | Chang et al. | 345/212 |

FOREIGN PATENT DOCUMENTS

| TW | 200841306 A | 10/2008 |
|---|---|---|
| TW | 200929145 A | 7/2009 |

OTHER PUBLICATIONS

Communication From the Taiwan Patent Office Regarding a Counterpart Foreign Application Dated (Taiwan Year 103) Sep. 23, 2014.

* cited by examiner

*Primary Examiner* — Hong Zhou
(74) *Attorney, Agent, or Firm* — Rosenberg, Klein & Lee

(57) ABSTRACT

The present invention relates to a decoding and scan driver, which comprises a level-shift circuit, a decoding circuit, an output driving circuit, and a control circuit. The level-shift circuit receives a plurality of input signals and shifts the voltage levels of the plurality of input signals for producing a plurality of decoding control signals. The decoding circuit is coupled to the level-shift circuit and produces a plurality of decoding signals according to the plurality of decoding control signals. The output driving circuit is coupled to the decoding circuit, produces a driving signal sequentially according to the plurality of decoding signals, and outputs the driving signal for driving a display panel. The control circuit is coupled to the output driving circuit, produces a control signal according to one of the plurality of input signals, and transmits the control signal to the output driving circuit for controlling the output driving circuit to output the driving signal. Thereby, the circuit area of the decoding and scan driver is saved and the cost is thus reduced.

17 Claims, 22 Drawing Sheets

DECODING AND SCAN DRIVER

FIELD OF THE INVENTION

The present invention relates generally to a decoding and scan driver, and particularly to a decoding and scan driver capable of saving circuit area.

BACKGROUND OF THE INVENTION

In modern times with progressive and developing technologies, liquid crystal displays (LCDs) have been extensively applied to electronic display products such as TV, computer displays, notebook computers, mobile phones, or personal digital assistants (PDAs). An LCD includes data drivers, scan drivers, and an LCD panel. An LCD panel comprises a pixel array. The scan drivers are used for turning on multiple pixel rows in the pixel array sequentially for scanning pixel data output by the data drivers to pixels and thus displaying images.

A general decoding and scan driver comprises a decoding circuit, a plurality of level-shift circuits, and drivers. The decoding circuit outputs a decoding signal to the plurality of level-shift circuits and the drivers according to a decoding control signal. Then the plurality of level-shift circuits and the drivers generate scan signals sequentially according to the decoding signal for scanning the display panel. The LCD panel uses the gate to turn on the internal cells and uses the source to transmit accurate voltages for controlling the orientation of the liquid crystals in the display panel. Because the output voltages of the gate are the high power-supply voltage (VGH) and the low reference voltage (VGL), high voltage devices should be adopted. The level-shift circuits and the drivers need to raise the scan signal to VGH and VGL, leading to increase of areas.

Nonetheless, because a general decoding and scan driver decodes at the low-voltage stage first and then drives the drivers via the plurality of level-shift circuits, each driver needs to have the level-shift circuit for shifting the level of the control signal, which means at least 10 high-voltage transistors and two resistors for forming a scan driver. Consequently, according to the prior art, the area, and thus the cost, of the scan driver are increased.

Moreover, because there are various types of scan drivers for LCD panels, for example, different sizes of LCD panels or different driving methods, the voltage of the driving signals generated by the scan drivers are different. However, according to the type of LCD panel, when the scan driver only needs to generate low-voltage driving signals, such as shifting from 1.8V to 5V or from 1.8V to −5V, if the decoding and scan driver adopts the level-shift circuit, the circuit area of the decoding and scan driver increases, resulting in increase in cost.

Accordingly, the present invention provides a novel decoding and scan driver for saving the area as well as the cost.

SUMMARY

An objective of the present invention is to provide a decoding and scan driver, which can save the circuit area of the decoding and scan driver and thus reducing cost.

Another objective of the present invention is to provide a decoding and scan driver, which uses an inverter for feeding back to a control latch unit and thus reducing the bias current.

Still another objective of the present invention is to provide a decoding and scan driver, which uses an output voltage of an inverter and requires no level-shift circuit for shifting level and decoding. Thereby, the circuit area of the decoding and scan driver is saved and hence the cost is reduced.

The decoding and scan driver according to the present invention comprises a level-shift circuit, a decoding circuit, an output driving circuit, and a control circuit. The level-shift circuit receives a plurality of input signals and shifts the voltage levels of the plurality of input signals for producing a plurality of decoding control signals. The decoding circuit is coupled to the level-shift circuit and produces a plurality of decoding signals according to the plurality of decoding control signals. The output driving circuit is coupled to the decoding circuit, produces a driving signal sequentially according to the plurality of decoding signals, and outputs the driving signal for driving a display panel. The control circuit is coupled to the output driving circuit, produces a control signal according to one of the plurality of input signals, and transmits the control signal to the output driving circuit for controlling the output driving circuit to output the driving signal.

Furthermore, the decoding and driving circuit according to the present invention comprises a control latch unit and an inverter. The control latch unit is coupled to the control circuit and the decoding circuit and controlled by the control signal and the driving signal. The inverter has a first terminal and a second terminal. The first terminal of the inverter is coupled to the decoding circuit; the second terminal of the inverter is coupled to the control latch unit. The control latch unit includes a first transistor and a second transistor. A first terminal of the first transistor is coupled to a power supply; a second terminal of the first transistor is coupled to the decoding circuit and the first terminal of the inverter. The first transistor is controlled by the control signal. A first terminal of the second transistor is coupled to the power supply; a second terminal of the second transistor is coupled to the second terminal of the first transistor, the decoding circuit, and the first terminal of the inverter. The second transistor is controlled by the control signal. Thereby, the present invention uses the inverter for feeding back to the control latch unit and thus reducing the bias current.

Besides, the decoding and scan driver according another embodiment of the present invention comprises a level-shift circuit, a decoding circuit, an output driving circuit, and a control circuit. The level-shift circuit receives a plurality of input signals and shifts the voltage levels of the plurality of input signals for producing a plurality of decoding control signals. The decoding circuit is coupled to the level-shift circuit and produces a plurality of decoding signals according to the plurality of decoding control signals. The output driving circuit is coupled to the decoding circuit, produces a driving signal sequentially according to the plurality of decoding signals, and outputs the driving signal. The control circuit is coupled to the output driving circuit and the decoding circuit, produces a control signal according to one of the plurality of input signals, and transmits the control signal to the output driving circuit and the decoding circuit for controlling the output driving circuit to output the driving signal.

In addition, the decoding and scan driver according another embodiment of the present invention comprises a decoding circuit, an output driving circuit, and a control circuit. The decoding circuit receives a plurality of input signals and produces a plurality of decoding control signals according to the plurality of input signals. The output driving circuit is coupled to the decoding circuit, produces a high-level driving signal sequentially according to the plurality of decoding signals, and outputs the driving signal. The control circuit is coupled to the output driving circuit, produces a control signal according to one of the plurality of input signals, and transmits the control signal to the output driving circuit for controlling the output driving circuit to output the driving signal. The present invention uses an output voltage of an inverter and requires no level-shift circuit. Thereby, the circuit area of the decoding and scan driver is saved and hence the cost is reduced.

Moreover, the decoding and scan driver according still another embodiment of the present invention comprises a decoding circuit, an output driving circuit, and a control circuit. The decoding circuit receives a plurality of input signals and produces a plurality of decoding control signals according to the plurality of input signals. The output driving circuit is coupled to the decoding circuit, produces a low-level driving signal sequentially according to the plurality of decoding signals, and outputs the driving signal. The control circuit is coupled to the output driving circuit, produces a control signal according to one of the plurality of input signals, and transmits the control signal to the output driving circuit for controlling the output driving circuit to output the driving signal. The present invention uses an output voltage of an inverter and requires no level-shift circuit. Thereby, the circuit area of the decoding and scan driver is saved and hence the cost is reduced.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

In order to make the structure and characteristics as well as the effectiveness of the present invention to be further understood and recognized, the detailed description of the present invention is provided as follows along with embodiments and accompanying figures.

Figure 1:
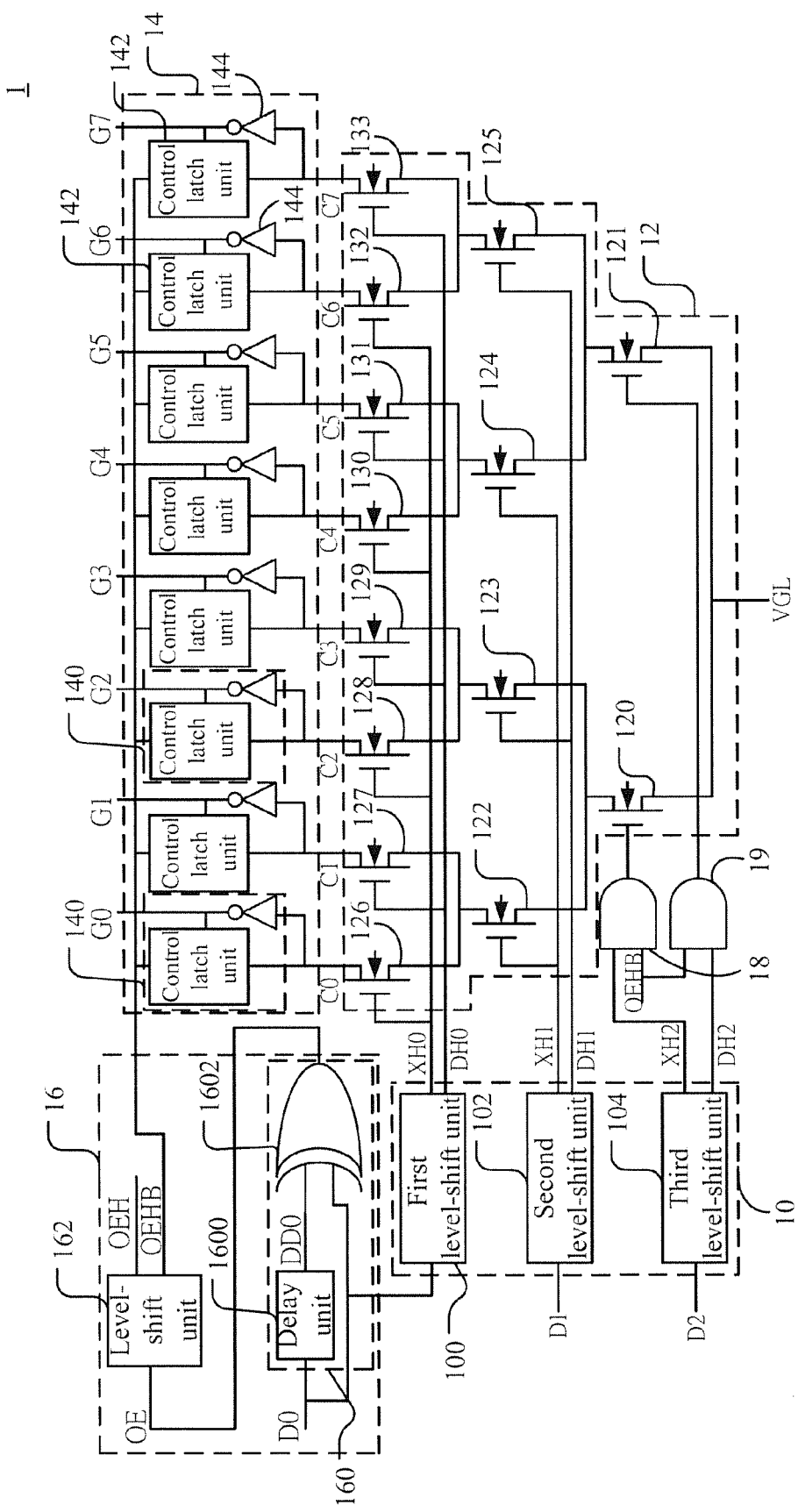
FIG. 1 shows a circuit diagram of the decoding and scan driver according the first embodiment of the present invention.

FIG. 1 shows a circuit diagram of the decoding and scan driver according an embodiment of the present invention. As shown in the figure, the decoding and scan driver according to the present invention comprises a level-shifting circuit 10, a decoding circuit 12, an output driving circuit 14, and a control circuit 16. The level-shift circuit 10 receives a plurality of input signals and shifts the voltage levels of the plurality of input signals for producing a plurality of decoding control signals. The decoding circuit 12 is coupled to the level-shift circuit 10 and produces a plurality of decoding signals according to the plurality of decoding control signals. According to the present embodiment, the decoding circuit 12 is a 3-to-8 decoder. Namely, the level-shift circuit 10 and the decoding circuit 12 receive a 3-bit input signal $D_2D_1D_0$. Thereby, the level-shift circuit 10 according to the present embodiment includes a first level-shift unit 100, a second level-shift unit 102, and a third level-shift unit 104.

The first level-shift unit 100 receives the input signal $D_0$ and shifts the voltage level of the input signal $D_0$ for producing a first in-phase input signal DH0 and a first inverse input signal XH0. The first in-phase input signal DH0 is in phase with the input signal $D_0$, while the first inverse input signal XH0 is the inverse of the input signal $D_0$. Likewise, the second level-shift unit 102 receives the input signal $D_1$ and shifts the voltage level of the input signal $D_1$ for producing a second in-phase input signal DH1 and a second inverse input signal XH1. The second in-phase input signal DH1 is in phase with the input signal $D_1$, while the second inverse input signal XH1 is the inverse of the input signal $D_1$. Besides, the third level-shift unit 104 receives the input signal $D_2$ and shifts the voltage level of the input signal $D_2$ for producing a third in-phase input signal DH2 and a third inverse input signal XH2. The third in-phase input signal DH2 is in phase with the input signal $D_2$, while the third inverse input signal XH2 is the inverse of the input signal $D_2$.

The decoding circuit 12 receives the first in-phase input signal DH0, the first inverse input signal XH0, the second in-phase input signal DH1, the second inverse input signal XH1, the third in-phase input signal DH2, and the third inverse input signal XH2 and outputs the corresponding 8-bit decoding signal $C_7C_6C_5C_4C_3C_2C_1C_0$. In other words, the decoding circuit 12 outputs the corresponding 8-bit decoding signal $C_7C_6C_5C_4C_3C_2C_1C_0$ according to the input signal $D_2D_1D_0$. For example, when the input signal $D_2D_1D_0$ is 001, the decoding signal $C_7C_6C_5C_4C_3C_2C_1C_0$ output by decoding circuit 12 is 00000010; when the input signal $D_2D_1D_0$ is 010, the decoding signal $C_7C_6C_5C_4C_3C_2C_1C_0$ output by decoding circuit 12 is 00000100, etc.

The output driving circuit 14 is coupled to the decoding circuit 12, and produces and outputs a driving signal according to the plurality of decoding signal, which is a low-level driving signal. When the decoding and scan driver 1 according to the present invention is applied to the LCD, the decoding and scan driver 1 will produce the driving signal sequentially and output it to each pixel structure on each row of the display panel for controlling turning on of the thin-film transistors in the pixel structures on each row. Thereby, a plurality of display data can be input to the pixel structures on each row via the thin-film transistors for driving the plurality of pixel structures to display images. This is the basic driving method of LCDs. A person having ordinary skills in the art can know it well. Hence, the details will not be described further.

The control circuit 16 is coupled to the driving circuit 14, and produces a control signal OEHB according to one of the plurality of input signals and transmits the control signal OEHB to the output driving circuit 14 for controlling the output driving circuit 14 to output the driving signal. According to the present invention, the control circuit 16 produces the control signal OEHB according to the least significant bit $D_0$ of the plurality of input signals $D_2D_1D_0$. The control circuit 16 includes an enable circuit 160 and a level-shift unit 162. The enable circuit 160 receives the input signal $D_0$ and produces an enable signal OE according to the input signal $D_0$. The level-shift unit 162 is coupled to the enable circuit 160, and shifts the voltage level of the enable signal OE for producing the control signal OEHB.

In addition, the enable circuit 160 includes a delay unit 1600 and a logic gate 1602. The delay unit 1600 receives the least significant bit $D_0$ of the plurality of input signals $D_2D_1D_0$ and delays the input signal $D_0$ for producing a delay signal DD0. The logic gate 1602 has a first input, a second input, and an output. The first input of the logic gate 1602 is coupled to the delay unit 1600 for receiving the delay signal DD0. The second input of the logic gate 1602 receives the input signal $D_0$, produces the enable signal OE at the output of the logic gate 1602, and transmits the enable signal OE to the level-shift unit 162. According to the present embodiment, the logic gate 1602 is an XNOR gate.

The output driving circuit 14 according to the present invention includes a plurality of output driving units 140. Each output driving unit 140 corresponds to the output of each decoding circuit 12, namely, to each output of the decoding and scan driver 1. Each output driving unit 140 includes a plurality of control latch unit 142 and a plurality of inverters 144. Each control latch unit 142 corresponds to each inverter 144. In addition, each set of the control latch unit 142 and the inverter 144 corresponds to the output of each decoding circuit 12. For example, the output of the decoding circuit 12 according to the present embodiment has the 8-bit decoding signal $C_7C_6C_5C_4C_3C_2C_1C_0$. Thereby, the output driving circuit 14 includes 8 control latch units 142 and 8 inverters 144. The control latch unit 142 is coupled to the control circuit 16 and the decoding circuit 12 and controlled by the control signal OEHB and the driving signal G7~G0. The inverter 144 has a first terminal and a second terminal. The first terminal of the inverter 144 is coupled to the decoding circuit 12; the second terminal of the inverter 144 is coupled to the control latch unit 142 and the output of the decoding and scan driver 1.

Figure 2:
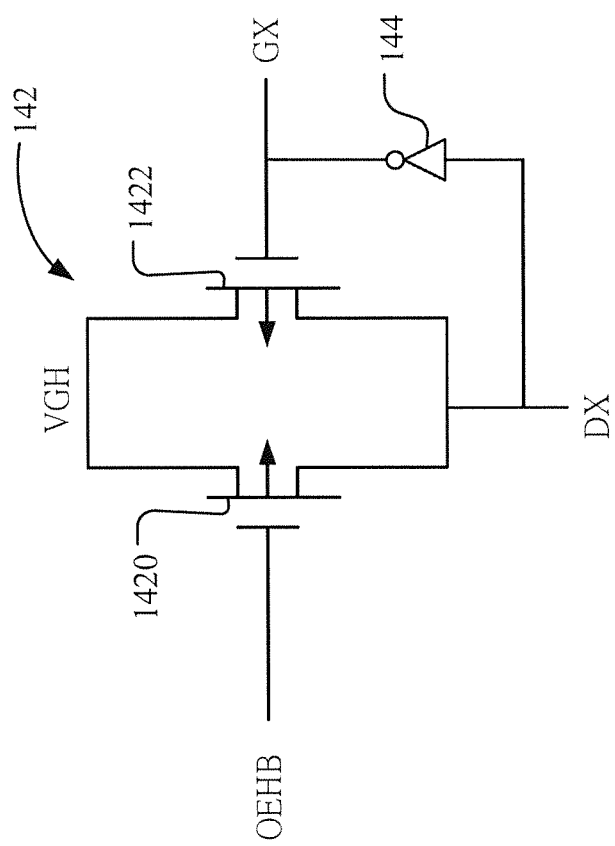
FIG. 2 shows a detailed circuit diagram of the control latch unit and the inverter according to the first embodiment of the present invention.

FIG. 2 shows a detailed circuit diagram of the control latch unit and the inverter according to an embodiment of the present invention. As shown in the figure, the control latch unit 142 according to the present invention includes a first transistor 1420 and a second transistor 1422. A first terminal of the first transistor 1420 is coupled to a power supply terminal VGH. A second terminal of the first transistor 1420 is coupled to the decoding circuit 12 and the first terminal of the inverter 144. The first transistor 1420 is controlled by the control signal OEHB. A first terminal of the second transistor 1422 is coupled to the power supply terminal VGH. A second terminal of the second transistor 1422 is coupled to the first transistor 1420, the decoding circuit 12, and the first terminal of the inverter 144; the second transistor 1422 is controlled by the driving signal. According to the present embodiment, the second transistor 1422 is a field-effect transistor. Thereby, the gate of the second transistor 1422 is coupled to the output of the decoding and scan driver 1 for receiving and being controlled by the driving signal. Accordingly, by means of coupling the first and second terminals of the inverter 144 to the gate and the second terminal of the second transistor 1422, respectively, namely, coupling the first and second terminals of the inverter 144 to the input and the output of the control latch unit 142, the inverter 144 is fed back to the control latch unit 142 for achieving the purpose of reducing the bias current or the leakage current.

Refer again to FIG. 1. The decoding circuit 12 according to the present embodiment includes a first switch 120, a second switch 121, a third switch 122, a fourth switch 123, a fifth switch 124, a sixth switch 125, a seventh switch 126, a eighth switch 127, a ninth switch 128, a tenth switch 129, a eleventh switch 130, a twelfth switch 131, a thirteenth switch 132, and a fourteenth switch 133. A first terminal of the first switch 120 is coupled to a reference voltage terminal VGL. The first switch 120 is controlled by the third level-shift unit 104 of the level-shift circuit 10 and hence controlled by the third inverse input signal XH2 output by the third level-shift unit 104. A first terminal of the second switch 121 is coupled to a reference voltage terminal VGL.

The second switch 121 is controlled by the third level-shift unit 104 of the level-shift circuit 10 and hence controlled by the third in-phase input signal DH2 output by the third level-shift unit 104.

A first terminal of the third switch 122 is coupled to a second terminal of the first switch 120. The third switch 122 is controlled by the second level-shift unit 102 of the level-shift circuit 10 and hence controlled by the second inverse input signal XH1 output by the second level-shift unit 102. A first terminal of the fourth switch 123 is coupled to the second terminal of the first switch 120 and the first terminal of the third switch 122. The fourth switch 123 is controlled by the second level-shift unit 102 of the level-shift circuit 10 and hence controlled by the second in-phase input signal DH1 output by the second level-shift unit 102. A first terminal of the fifth switch 124 is coupled to a second terminal of the second switch 121. The fifth switch 124 is controlled by the second level-shift unit 102 of the level-shift circuit 10 and hence controlled by the second inverse input signal XH1 output by the second level-shift unit 102. A first terminal of the sixth switch 125 is coupled to the second terminal of the second switch 121. The sixth switch 125 is controlled by the second level-shift unit 102 of the level-shift circuit 10 and hence controlled by the second in-phase input signal DH1 output by the second level-shift unit 102.

A first terminal of the seventh switch 126 is coupled to a second terminal of the third switch 122; a second terminal of the seventh switch 126 is coupled to the output driving circuit 14. The seventh switch 126 is controlled by the first level-shift unit 100 of the level-shift circuit 10 and hence controlled by the first inverse input signal XH0 output by the first level-shift unit 100. A first terminal of the eighth switch 127 is coupled to the second terminal of the third switch 122; a second terminal of the eighth switch 127 is coupled to the output driving circuit 14. The eighth switch 127 is controlled by the first level-shift unit 100 of the level-shift circuit 10 and hence controlled by the first in-phase input signal DH0 output by the first level-shift unit 100. A first terminal of the ninth switch 128 is coupled to the second terminal of the fourth switch 123; a second terminal of the ninth switch 128 is coupled to the output driving circuit 14. The ninth switch 126 is controlled by the first level-shift unit 100 of the level-shift circuit 10 and hence controlled by the first inverse input signal XH0 output by the first level-shift unit 100. A first terminal of the tenth switch 129 is coupled to the second terminal of the fourth switch 123; a second terminal of the tenth switch 129 is coupled to the output driving circuit 14. The tenth switch 129 is controlled by the first level-shift unit 100 of the level-shift circuit 10 and hence controlled by the first in-phase input signal DH0 output by the first level-shift unit 100.

A first terminal of the eleventh switch 130 is coupled to a second terminal of the fifth switch 124; a second terminal of the eleventh switch 130 is coupled to the output driving circuit 14. The eleventh switch 130 is controlled by the first level-shift unit 100 of the level-shift circuit 10 and hence controlled by the first inverse input signal XH0 output by the first level-shift unit 100. A first terminal of the twelfth switch 131 is coupled to the second terminal of the fifth switch 122; a second terminal of the twelfth switch 131 is coupled to the output driving circuit 14. The twelfth switch 131 is controlled by the first level-shift unit 100 of the level-shift circuit 10 and hence controlled by the first in-phase input signal DH0 output by the first level-shift unit 100. A first terminal of the thirteenth switch 132 is coupled to a second terminal of the sixth switch 125; a second terminal of the thirteenth switch 132 is coupled to the output driving circuit 14. The thirteenth switch 132 is controlled by the first level-shift unit 100 of the level-shift circuit 10 and hence controlled by the first inverse input signal XH0 output by the first level-shift unit 100. A first terminal of the fourteenth switch 133 is coupled to a second terminal of the sixth switch 125; a second terminal of the fourteenth switch 133 is coupled to the output driving circuit 14. The fourteenth switch 133 is controlled by the first level-shift unit 100 of the level-shift circuit 10 and hence controlled by the first in-phase input signal DH0 output by the first level-shift unit 100. The first to fourth switches 120~133 are field-effect transistors.

Accordingly, the decoding circuit 12 controls the value of the decoding signal $C_7C_6C_5C_4C_3C_2C_1C_0$ at the output of the decoding circuit 12 according to the plurality of input signals. For example, when the input signal $D_2D_1D_0$ is 000, the first, the third, the fifth, the seventh, the ninth, the eleventh, and the thirteenth switches 120, 122, 124, 126, 128, 130, 132 are turned on and the rest switches are cut off. Because the first, the third, and the seventh switches 120, 122, 126 are turned on, a reference voltage will be passed from the reference voltage terminal VGL, the first, the third, and the seventh switches 120, 122, 126 to the output G0 of the decoding and scan driver 1 for driving the decoding and scan driver 1 to output 00000001 as the driving signal G7G6G5G4G3G2G1G0. Likewise, when the input signal $D_2D_1D_0$ is 001, the first, the third, the fifth, the eighth, the tenth, the twelfth, and the fourteenth switches 120, 122, 124, 127, 129, 131, 133 are turned on and the rest switches are cut off. Because the first, the third, and the eighth switches 120, 122, 127 are turned on, the reference voltage will be passed from the reference voltage terminal VGL, the first, the third, and the eighth switches 120, 122, 127 to the output G1 of the decoding and scan driver 1 for driving the decoding and scan driver 1 to output 00000010 as the driving signal G7G6G5G4G3G2G1G0. The rest cases can be deduced by analogy, and hence will not be described in details. The first to the fourteenth switches 120~133 are n-type field-effect transistors.

Moreover, the decoding and scan driver 1 according to the present invention further comprises a first logic unit 18 and a second logic unit 19. The first logic unit 18 has a first input, a second input, and an output. The first input of the first logic unit 18 is coupled to the third level-shift unit 104 of the level-shift circuit 10 for receiving the third inverse input signal XH2. The second input of the first logic unit 18 receives the control signal OEHB. The output of the first logic unit 18 is coupled to the first switch 120 of the decoding circuit 12. The second logic unit 19 has a first input, a second input, and an output. The first input of the second logic unit 19 is coupled to the third level-shift unit 104 of the level-shift circuit 10 for receiving the third in-phase input signal DH2. The second input of the second logic unit 19 receives the control signal OEHB. The output of the second logic unit 19 is coupled to the second switch 121 of the decoding circuit 12. Because the plurality of input signals $D_2D_1D_0$ run from 000 to 111 sequentially, the first logic unit 18 will produce a high-level signal first to the first switch 120 for turning on the first switch 120. At this moment, the second logic unit 19 will produce a low-level signal to the second switch 120 for cutting off the second switch 121. Thereby, large transient currents can be avoided.

Figure 3:
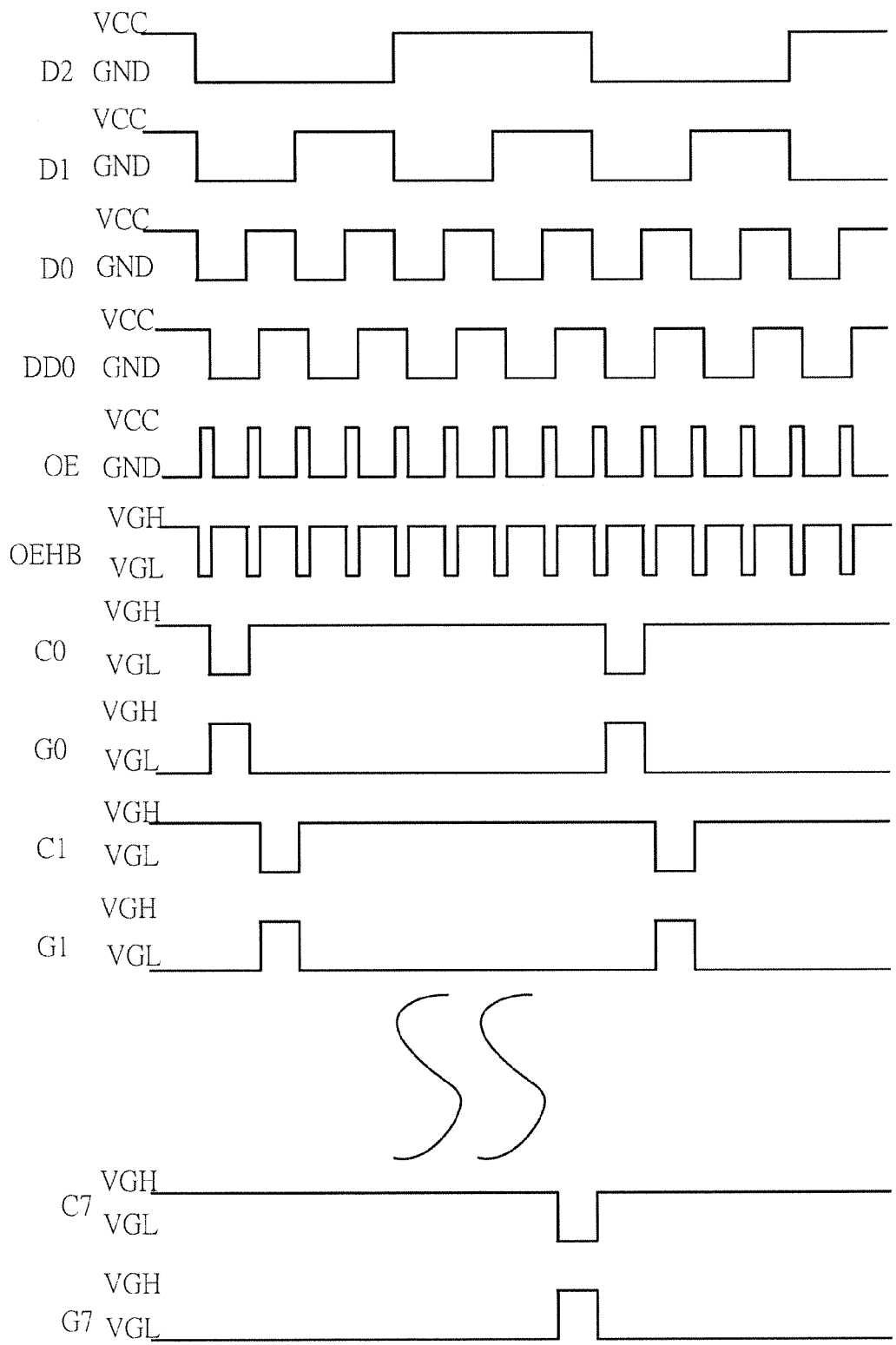
FIG. 3 shows timing diagrams of the decoding and scan driver according to the present invention in FIG. 1.

FIG. 3 shows timing diagrams of the decoding and scan driver according to the present invention in FIG. 1. As shown in the figure, when the plurality of input signals $D_2D_1D_0$ are 000, the enable circuit 160 of the control circuit 16 delay some time for generating the enable signal OE and the control signal OEHB. At this moment, the first, the third, the fifth, the seventh, the ninth, the eleventh, and the thirteenth switches 120, 122, 124, 126, 128, 130, 132 are turned on while the rest are cut off. Because the first, the third, and the seventh switches 120, 122, 126 are turned on, the reference voltage will pass from the reference voltage terminal VGL, the first, the third, and the seventh switches 120, 122, 126 to the output C0 of the decoding circuit 12 for making the decoding signal C7C6C5C4C3C2C1C0 output by the decoding and scan driver 1 be 11111110. At this time, the voltage level of the decoding signal C0 is low VGL. Nonetheless, after passing the inverter 144, the driving signal G0 with a high voltage level VGH is generated. Likewise, when the plurality of input signals $D_2D_1D_0$ are 001, the first, the third, the fifth, the eighth, the tenth, the twelfth, and the fourteenth switches 120, 122, 124, 127, 129, 131, 133 are turned on while the rest are cut off. Because the first, the third, and the eighth switches 120, 122, 127 are turned on the reference voltage will pass from the reference voltage terminal VGL, the first, the third, and the eighth switches 120, 122, 127 to the output C1 of the decoding circuit 12 for making the decoding signal C7C6C5C4C3C2C1C0 output by the decoding circuit 12 be 11111101. At this time, the voltage level of the decoding signal C1 is low VGL. Nonetheless, after passing the inverter 144, the driving signal G1 with a high voltage level VGH is generated. The rest states of the plurality of input signals $D_2D_1D_0$ can be deduced by analogy, and hence will not be described in details.

Figure 4:
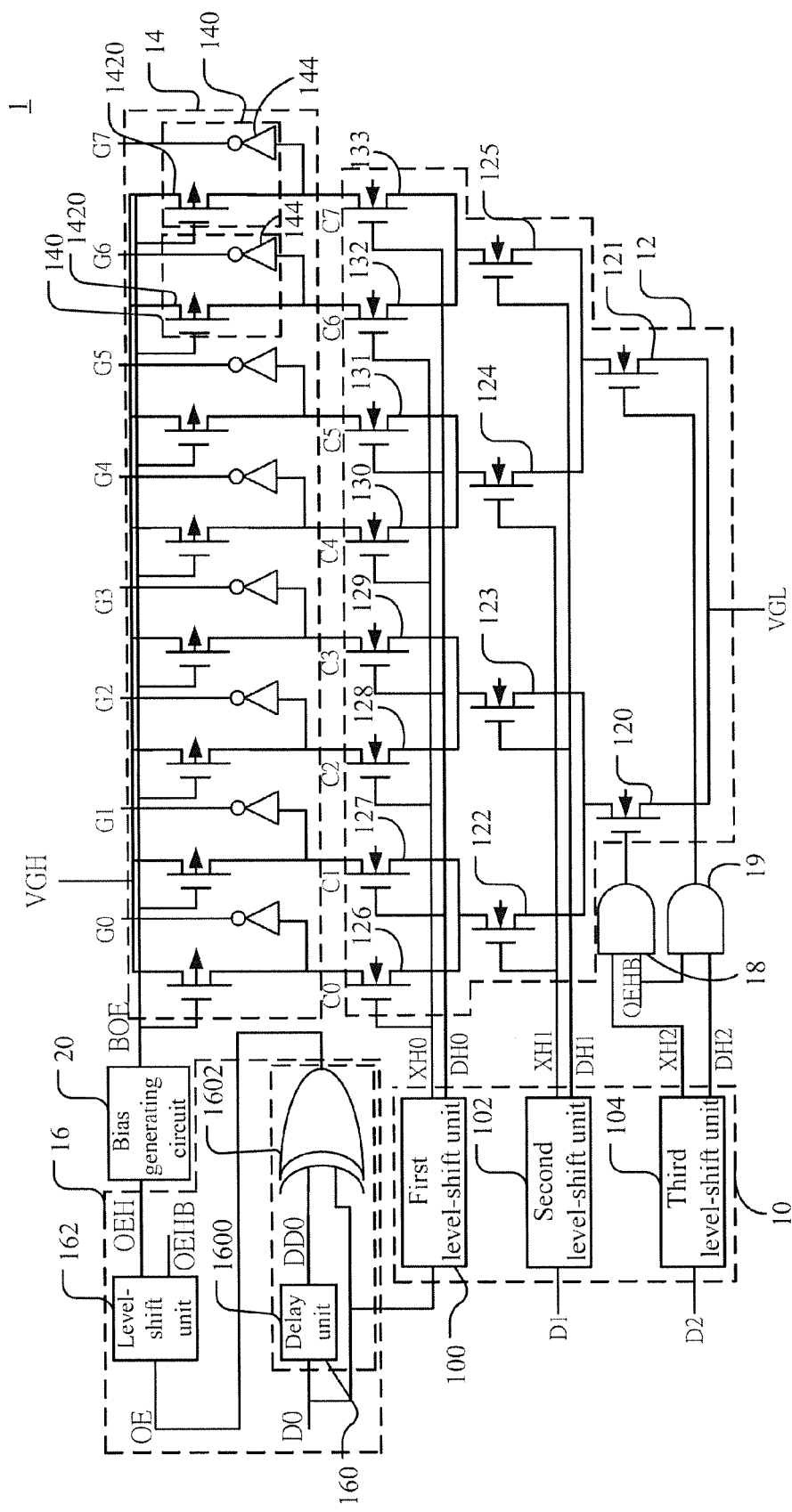
FIG. 4 shows a circuit diagram of the decoding and scan driver according the second embodiment of the present invention.

FIG. 4 shows a circuit diagram of the decoding and scan driver according a second embodiment of the present invention. As shown in the figure, the difference between the decoding and scan driver 1 according to the present embodiment and the one according to the embodiment in FIG. 1 is that each control latch unit 142 in the plurality of output driving units 140 according to the present embodiment includes one first transistor 1420 only. The first terminals of the first transistors 1420 are coupled together; the second terminal of each first transistor 1420 is coupled to the first terminal of the inverter 144.

Figure 5:
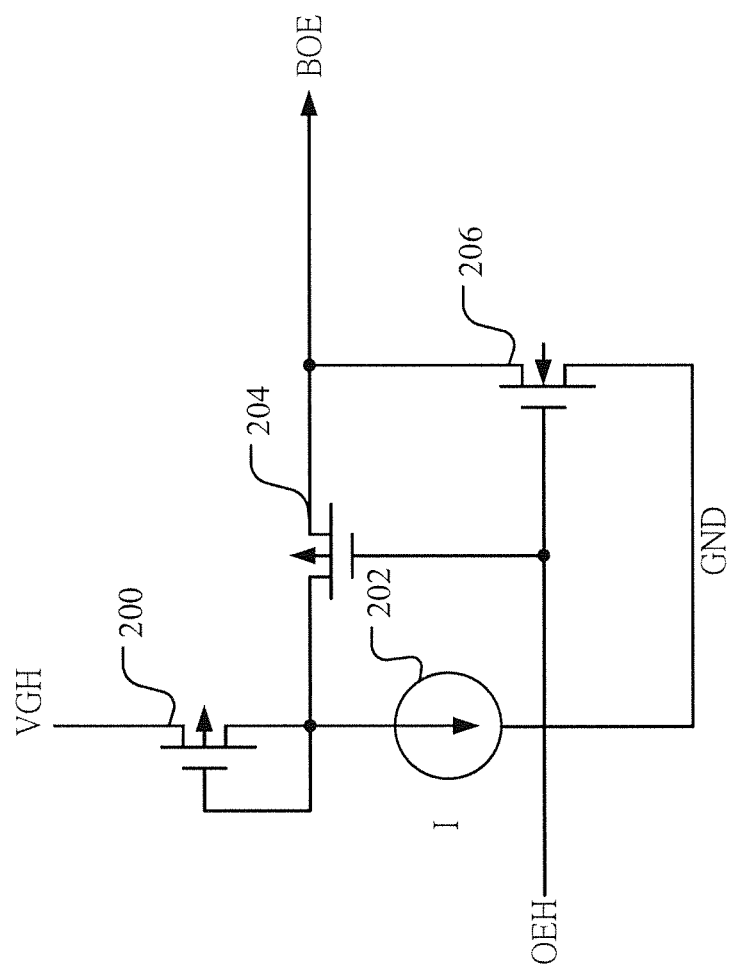
FIG. 5 shows a circuit diagram of the bias generating circuit according an embodiment of the present invention.

In addition, the decoding and scan driver 1 according to the present embodiment further comprises a bias generating circuit 20. The bias generating circuit 20 is coupled to the level-shift unit 162 of the control circuit 16 and generates the control signal BOE according to an output signal OEH of the level-shift unit 162. FIG. 5 shows a circuit diagram of the bias generating circuit according an embodiment of the present invention. As shown in the figure, the bias generating circuit 20 according to the present embodiment comprises a first impedance device 200, a first current source 202, a first switch 204, and a second switch 206. A terminal of the first impedance device 200 receives a power supply VGH; the other terminal of the first impedance device 200, which is a transistor, is coupled to a first terminal of the first current source 202. A second terminal of the first current source 202 is coupled to the ground. A first terminal of the first switch 204 is coupled to the first terminal of the first impedance device 200 and the first terminal of the first current source 202. The first switch 204 is controlled by the output signal OEH of the level-shift unit 162. A first terminal of the second switch 206 is coupled to the second terminal of the first switch 204. Besides, the second terminal of the second switch 206 is coupled to the ground. The second switch 206 is controlled by the output signal OEH of the level-shift unit 162. The first switch 204 and the second switch 20 produce the control signal BOE according to the output signal OEH of the level-shift unit 162. According to the present embodiment, the first switch 204 and the second switch 206 are a p-type transistor and an n-type transistor, respectively. Thereby, when the output signal OEH of the level-shift unit 162 is low, the first switch 204 is turned on while the second switch 206 is cut off, and thus producing the control signal BOE.

Figure 6:
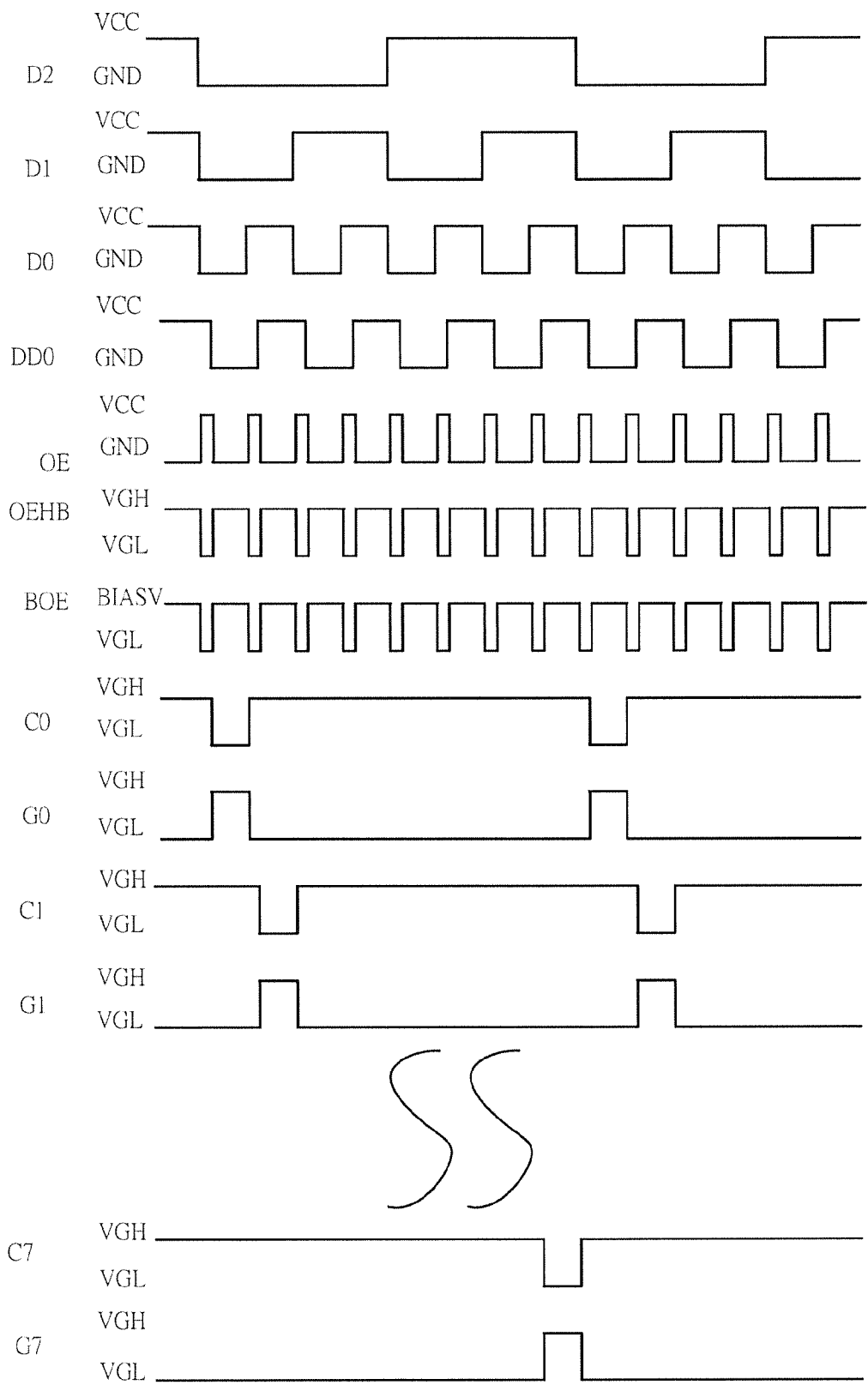
FIG. 6 shows timing diagrams of the decoding and scan driver according to the present invention in FIG. 4.

FIG. 6 shows timing diagrams of the decoding and scan driver according to the present invention in FIG. 4. As shown in the figure, the difference between the timing diagram of the decoding and scan driver according to the present embodiment and those according to the embodiment in FIG. 3 is that the embodiment adopts the bias generating circuit for the signal OEH output by the control circuit 16, and produces and transmits the control signal BOE to the output driving circuit 14 for producing the plurality of driving signals G7~G0. The timing of the rest signals is already described in FIG. 3, and hence will not be described in more details.

Figure 7:
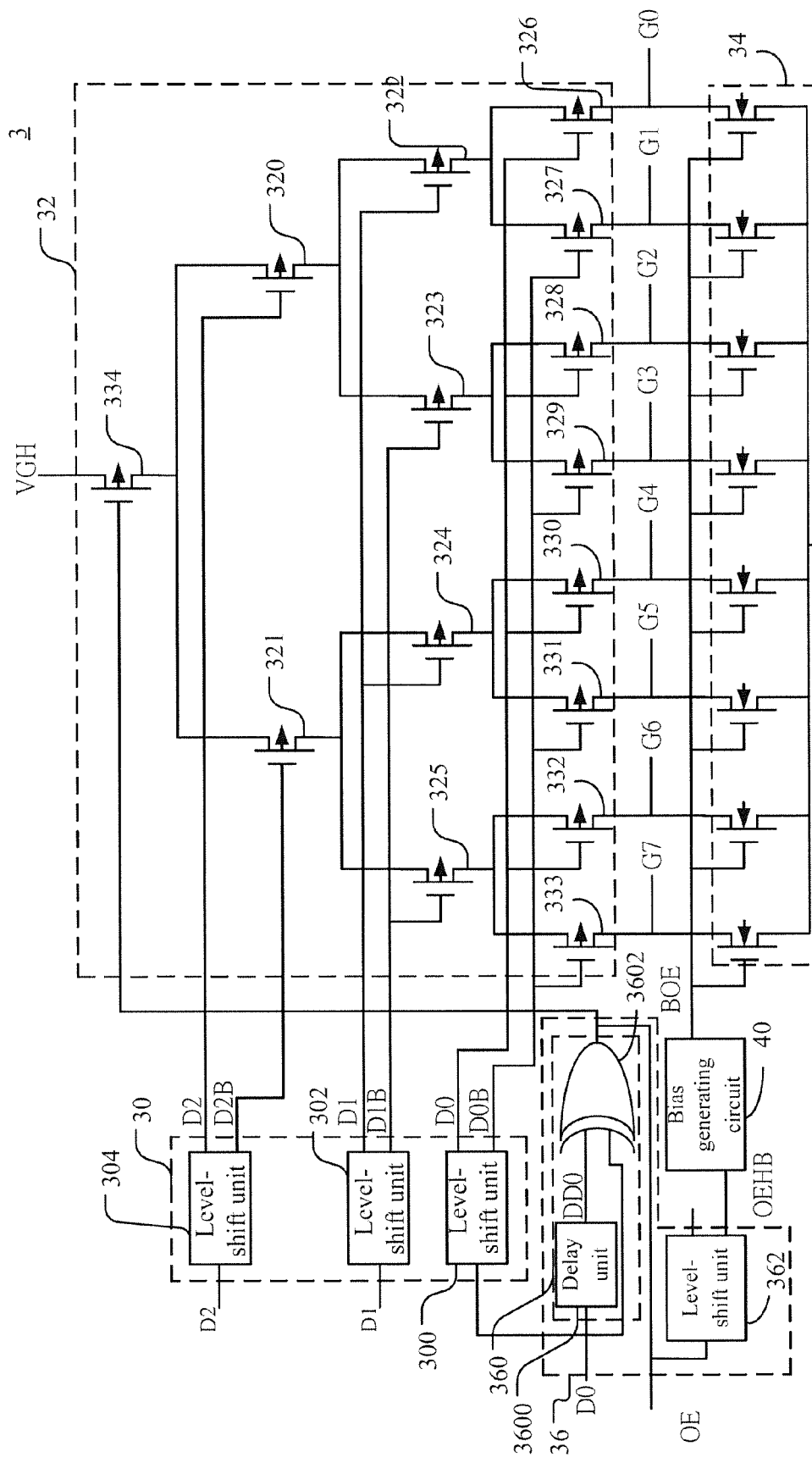
FIG. 7 shows a circuit diagram of the decoding and scan driver according the third embodiment of the present invention.

FIG. 7 shows a circuit diagram of the decoding and scan driver according the third embodiment of the present invention. As shown in the figure, the difference between the decoding and scan driver 3 according to the present embodiment and the decoding and scan driver 1 according to the previous embodiments is that a plurality of switches of a decoding circuit 32 of the decoding and scan driver 3 according to the present embodiment are p-type field-effect transistors. Thereby, an output driving circuit 34 can produce and output a high-level driving signal. The decoding circuit 32 includes a first switch 320, a second switch 321, a third switch 322, a fourth switch 323, a fifth switch 324, a sixth switch 325, a seventh switch 326, a eighth switch 327, a ninth switch 328, a tenth switch 329, a eleventh switch 330, a twelfth switch 331, a thirteenth switch 332, and a fourteenth switch 333. A first terminal of the first switch 320 is used for receiving the power supply VGH. The first switch 320 is controlled by a third level-shift unit 304 of a level-shift circuit 30 and hence controlled by the third in-phase input signal D2 output by the third level-shift unit 304. A first terminal of the second switch 321 receives the power supply VGH. The second switch 321 is controlled by the third level-shift unit 304 of the level-shift circuit 30 and hence controlled by the third inverse input signal D2B output by the third level-shift unit 304.

A first terminal of the third switch 322 is coupled to a second terminal of the first switch 320. The third switch 322 is controlled by the second level-shift unit 302 of the level-shift circuit 30 and hence controlled by the second in-phase input signal D1 output by the second level-shift unit 302. A first terminal of the fourth switch 323 is coupled to the second terminal of the first switch 320 and the first terminal of the third switch 322. The fourth switch 323 is controlled by the second level-shift unit 302 of the level-shift circuit 30 and hence controlled by the second inverse input signal D1B output by the second level-shift unit 302. A first terminal of the fifth switch 324 is coupled to a second terminal of the second switch 321. The fifth switch 324 is controlled by the second level-shift unit 302 of the level-shift circuit 30 and hence controlled by the second in-phase input signal D1 output by the second level-shift unit 302. A first terminal of the sixth switch 325 is coupled to the second terminal of the second switch 321. The sixth switch 325 is controlled by the second level-shift unit 302 of the level-shift circuit 10 and hence controlled by the second inverse input signal D1B output by the second level-shift unit 302.

A first terminal of the seventh switch 326 is coupled to a second terminal of the third switch 322; a second terminal of the seventh switch 326 is coupled to an output driving circuit 34. The seventh switch 326 is controlled by the first level-shift unit 300 of the level-shift circuit 30 and hence controlled by the first in-phase input signal D0 output by the first level-shift unit 300. A first terminal of the eighth switch 327 is coupled to the second terminal of the third switch 322; a second terminal of the eighth switch 327 is coupled to the output driving circuit 34. The eighth switch 327 is controlled by the first level-shift unit 300 of the level-shift circuit 30 and hence controlled by the first inverse input signal D0B output by the first level-shift unit 100. A first terminal of the ninth switch 328 is coupled to the second terminal of the fourth switch 323; a second terminal of the ninth switch 328 is coupled to the output driving circuit 34. The ninth switch 326 is controlled by the first level-shift unit 300 of the level-shift circuit 30 and hence controlled by the first in-phase input signal D0 output by the first level-shift unit 300. A first terminal of the tenth switch 329 is coupled to the second terminal of the fourth switch 323; a second terminal of the tenth switch 329 is coupled to the output driving circuit 34. The tenth switch 329 is controlled by the first level-shift unit 300 of the level-shift circuit 30 and hence controlled by the first inverse input signal D0B output by the first level-shift unit 300.

A first terminal of the eleventh switch 330 is coupled to a second terminal of the fifth switch 324; a second terminal of the eleventh switch 330 is coupled to the output driving circuit 34. The eleventh switch 330 is controlled by the first level-shift unit 300 of the level-shift circuit 30 and hence controlled by the first in-phase input signal D0 output by the first level-shift unit 300. A first terminal of the twelfth switch 331 is coupled to the second terminal of the fifth switch 322; a second terminal of the twelfth switch 331 is coupled to the output driving circuit 34. The twelfth switch 331 is controlled by the first level-shift unit 300 of the level-shift circuit 10 and hence controlled by the first inverse input signal D0B output by the first level-shift unit 300. A first terminal of the thirteenth switch 332 is coupled to a second terminal of the sixth switch 325; a second terminal of the thirteenth switch 332 is coupled to the output driving circuit 34. The thirteenth switch 332 is controlled by the first level-shift unit 300 of the level-shift circuit 30 and hence controlled by the first in-phase input signal D0 output by the first level-shift unit 300. A first terminal of the fourteenth switch 333 is coupled to a second terminal of the sixth switch 325; a second terminal of the fourteenth switch 333 is coupled to the output driving circuit 34. The fourteenth switch 333 is controlled by the first level-shift unit 300 of the level-shift circuit 30 and hence controlled by the first inverse input signal D0B output by the first level-shift unit 300.

Moreover, the decoding and scan driver 3 according to the present invention further comprises a fifteenth switch 334. A first terminal of the fifteenth switch 334 receives the power supply VGH; a second terminal of the fifteenth switch 334 is coupled to the first terminal of the first switch 320 and the first terminal of the second switch 321. The fifteenth switch 334 is controlled by a control circuit 36. Namely, an output of a level-shift unit 362 of the control circuit 36 is coupled to the fifteenth switch 334 for controlling its turning on or off.

Figure 8:
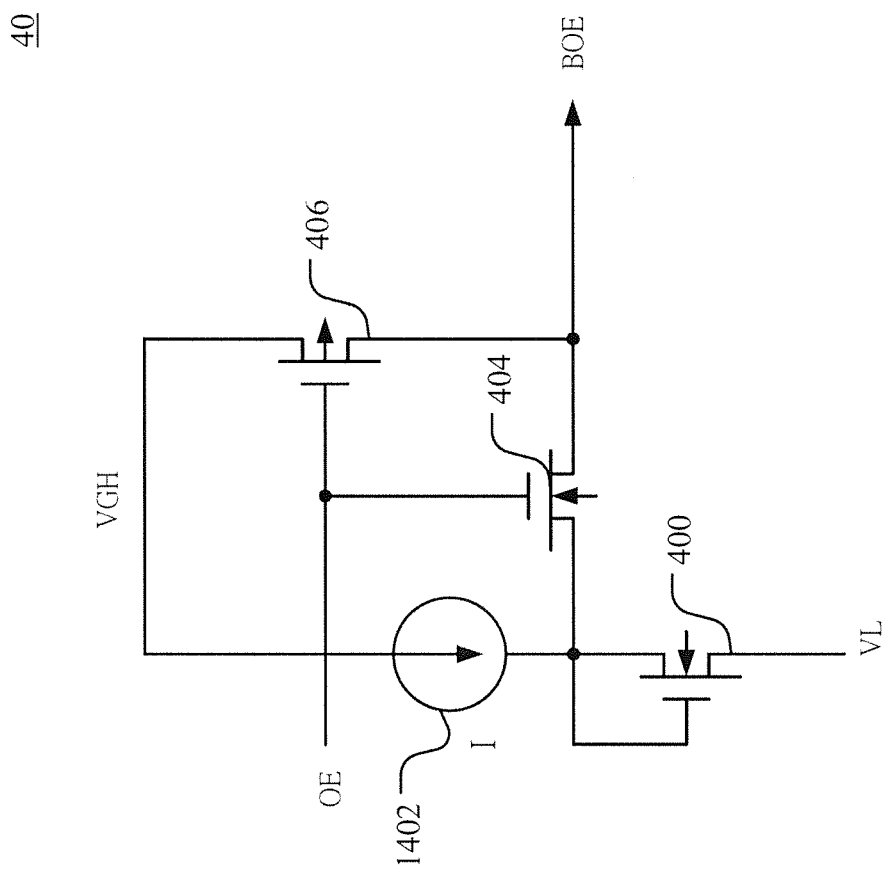
FIG. 8 shows a circuit diagram of the bias generating circuit according another embodiment of the present invention.

Furthermore, because the decoding circuit 32 according to the present embodiment adopts p-type transistors, the structure of the bias generating circuit 40 according to the present embodiment is different from that described above. As shown in FIG. 8, the bias generating circuit 40 according to the present embodiment comprises a second impedance device 40, a second current source 402, a third switch 404, and a fourth switch 406. A terminal of the second impedance device 400 receives the reference voltage VGL; a second terminal of the second impedance device 400 is coupled to a first terminal of the second current source 402. A second terminal of the second current source 402 receives the power supply VGH. A first terminal of the third switch 404 is coupled to the second terminal of the second impedance device 400 and the first terminal of the second current source 402. The third switch 404 is controlled by the output signal OE of the level-shift unit 362. A first terminal of the fourth switch 406 receives the power supply VGH. A second terminal of the fourth switch 206 is coupled to a second terminal of the third switch 404 for outputting the control signal BOE. The fourth switch 406 is controlled by the output signal OE of the level-shift unit 362.

Figure 9:
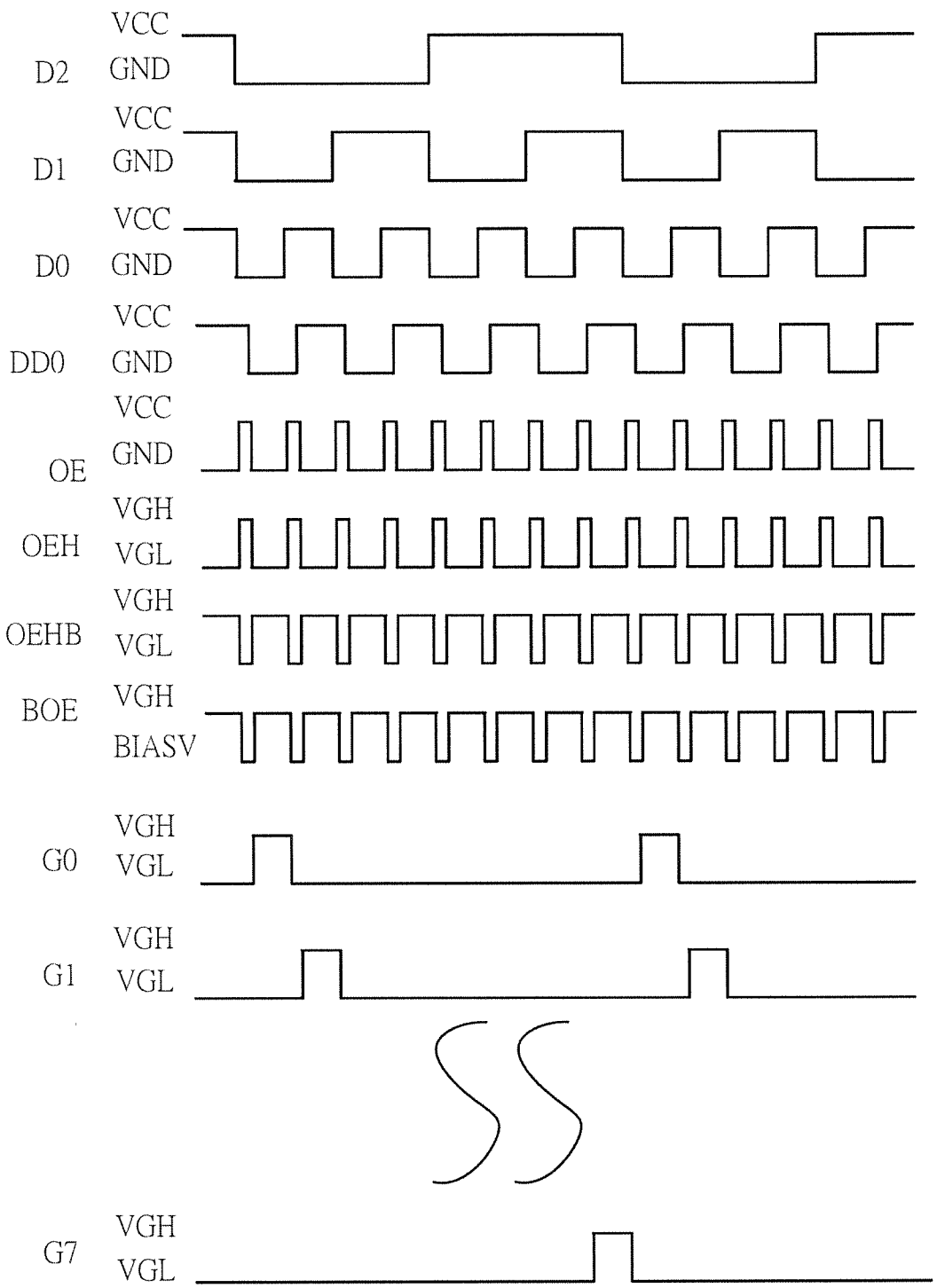
FIG. 9 shows timing diagrams of the decoding and scan driver according to the present invention in FIG. 7.

FIG. 9 shows timing diagrams of the decoding and scan driver according to the present invention in FIG. 7. As shown in the figure, the timing diagrams according to the present embodiment are similar to those according to the embodiment in FIG. 6. Hence, the details will not be described further.

Figure 10:
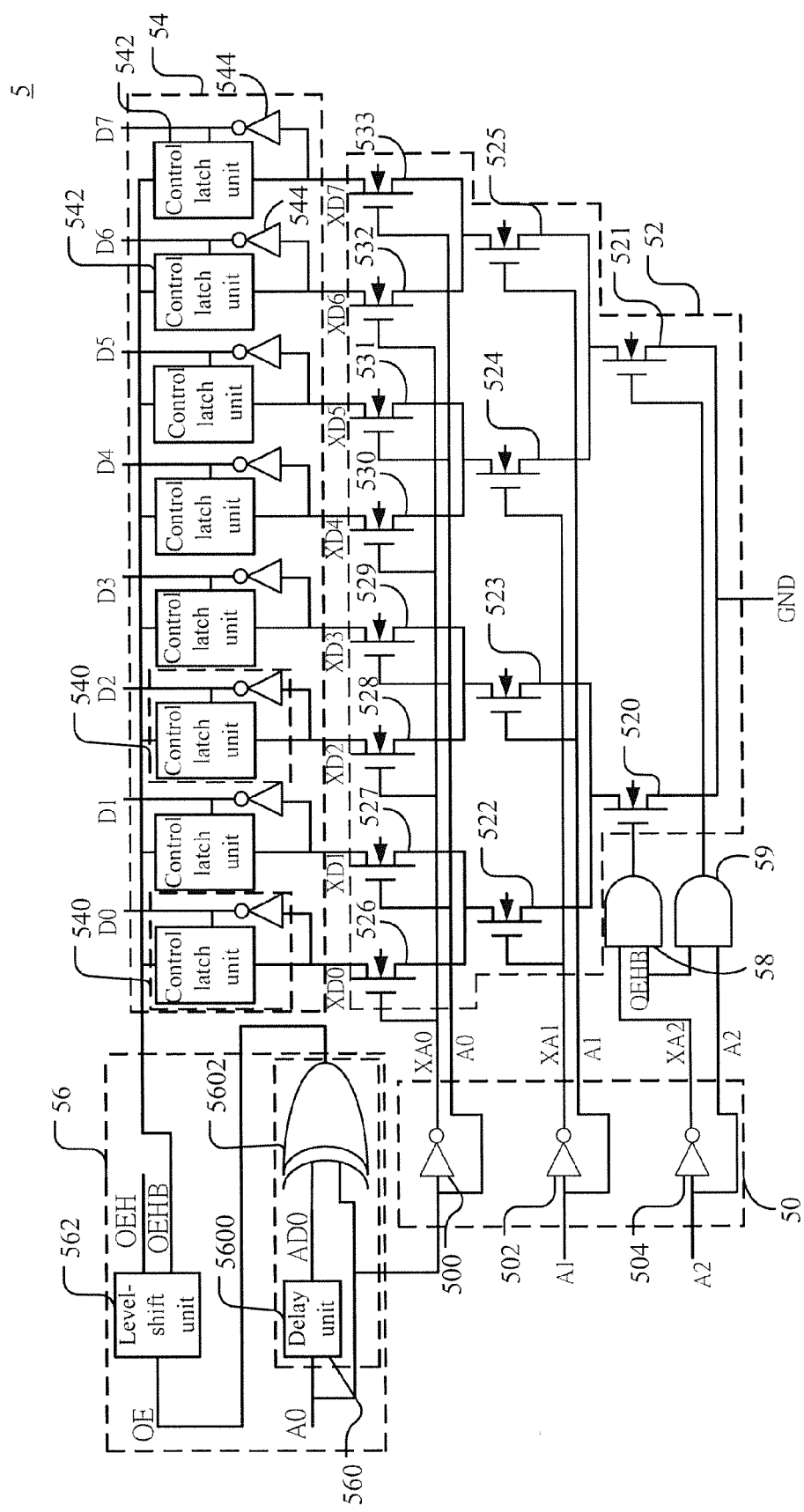
FIG. 10 shows a circuit diagram of the decoding and scan driver according the fourth embodiment of the present invention.

FIG. 10 shows a circuit diagram of the decoding and scan driver according the fourth embodiment of the present invention. As shown in the figure, the difference between the decoding and scan driver 5 according to the present embodiment and the decoding and scan driver 1 according to the embodiment in FIG. 1 is that when the decoding and scan driver 5 according to the present embodiment is applied to middle or low voltages, the decoding and scan driver 5 does not require the level-shift circuit 50. The decoding and scan driver 5 according to the present embodiment 5 comprises a decoding circuit 52, an output driving circuit 54, and a control circuit 56. The decoding circuit 52 receives a plurality of input signals $A_2A_1A_0$ and produces a plurality of decoding signal XD7XD6XD5XD4XD3XD2XD1XD0 according to the plurality of input signals $A_2A_1A_0$. The output driving circuit 54 is coupled to the decoding circuit 52, and produces and outputs a low-level driving signal D7D6D5D4D3D2D1D0 sequentially according to the plurality of decoding signals. The control circuit 56 is coupled to the output driving circuit 54. The control circuit 56 produces a control signal OEHB according to one of the plurality of input signals $A_2A_1A_0$ and transmits the control signal OEHB to the output driving circuit 54 for controlling the output driving circuit 54 to output the plurality of driving signals D7D6D5D4D3D2D1D0.

Besides, the decoding and scan driver 5 according to the present embodiment further comprises a plurality of inverters 500, 502, 504. The plurality of inverters 500, 502, 504 receives and inverts the plurality of input signals $A_2A_1A_0$ and transmits the plurality of inverted input signals $A_2A_1A_0$ to the decoding circuit 52. In other words, the plurality of inverters 500, 502, 504 invert the plurality of input signals $A_2A_1A_0$, produce a plurality of inverted input signal $XA_2XA_1XA_0$, and transmit the plurality of inverted input signal $XA_2XA_1XA_0$ to the decoding circuit 52.

The output driving circuit 54 includes a plurality of output driving units 540. Each output driving unit 540 includes a control latch unit 542 and an inverter 544. The control latch unit 542 includes a third transistor 5420 and a fourth transistor 5422. A first terminal of the third transistor 5420 receives a power supply VH; a second terminal of the third transistor 5420 is coupled to the decoding circuit 52. The third transistor 5420 is controlled by the control signal OEHB output by the control circuit 56. A first terminal of the fourth transistor 5422 receives the power supply VH; a second terminal of the fourth transistor 5422 is coupled to the second terminal of the third transistor 5420 and the decoding circuit 52. The fourth transistor 5422 is controlled by the decoding signal.

Figure 11:
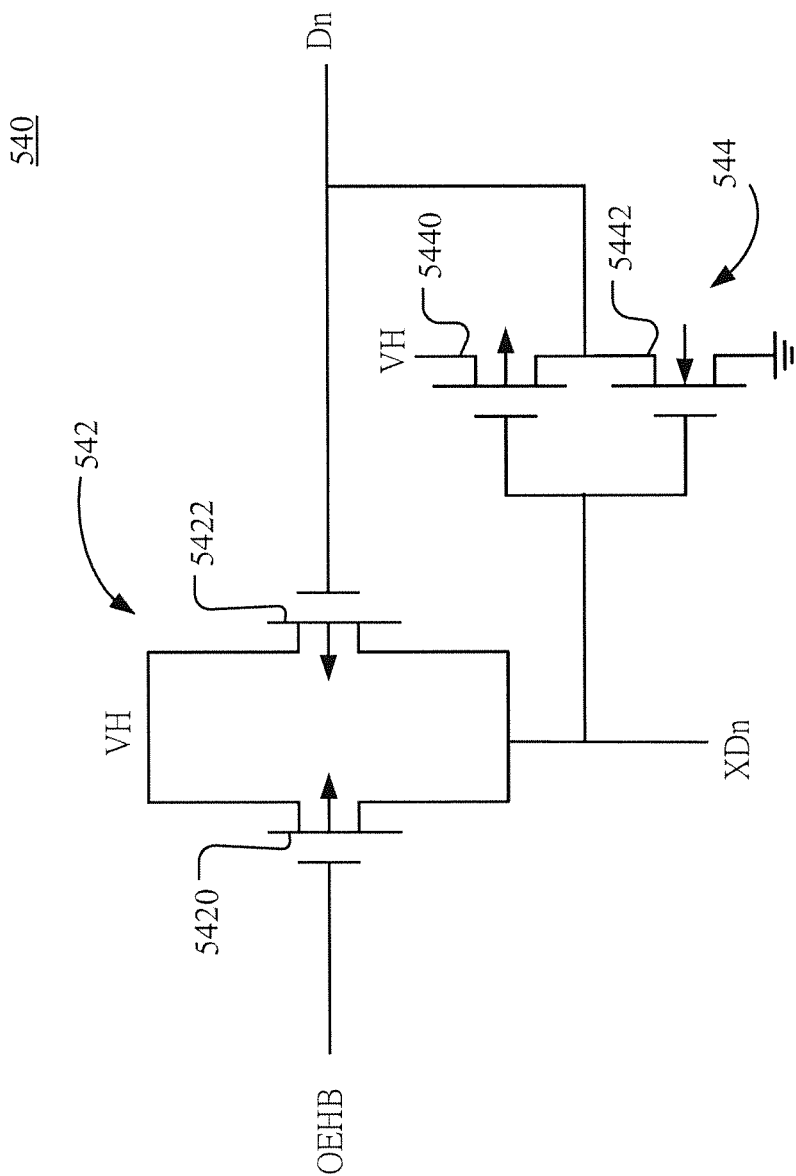
FIG. 11 shows a circuit diagram of the output driving unit according the fourth embodiment of the present invention.

FIG. 11 shows a circuit diagram of the output driving unit according the fourth embodiment of the present invention. As shown in the figure, the inverter 544 includes a fifth transistor 5440 and a sixth transistor 5442. A first terminal of the fifth transistor 5440 receives the power supply VH; a second terminal of the fifth transistor 5440 is coupled to a control terminal of the fourth transistor 5422. A control terminal of the fifth transistor 5440 is coupled to the second terminal of the third transistor 5420 and the second terminal of the fourth transistor. A first terminal of the sixth transistor 5442 is coupled to the second terminal of the fourth transistor 5422. A first terminal of the sixth transistor 5442 is coupled to the second terminal of the fifth transistor 5440; a second terminal of the sixth transistor 5442 is coupled to the ground. Besides, a control terminal of the sixth transistor 5442 is coupled to the control terminal of the fifth transistor 5440, the second terminal of the third transistor 5420, and the second terminal of the fourth transistor 5422. Thanks to the power supply VH, which is greater than the general power supply Vcc, of the control latch unit 542 and the inverter 544, the inverter 544 can shift the voltage level to the power supply VH. For example, the inverter 544 can shift the voltage 1.8V to 5V. Thereby, when the decoding and scan driver 5 is applied to middle or low voltage levels, the decoding and scan driver 5 needs not to use any level-shift circuit, and thus saving the circuit area.

According to the present invention, in addition to using an inverter, a multiplexer can be used instead for achieving the purpose of requiring no level-shift circuit and saving circuit area.

Moreover, the decoding circuit 52, the output driving circuit 54, and the control circuit 56 according to the present embodiment are the same as the decoding circuit 12, the output driving circuit 14, and the control circuit 16 of the decoding and scan driver 1 in FIG. 1. Hence, the details will not be described again.

Figure 12:
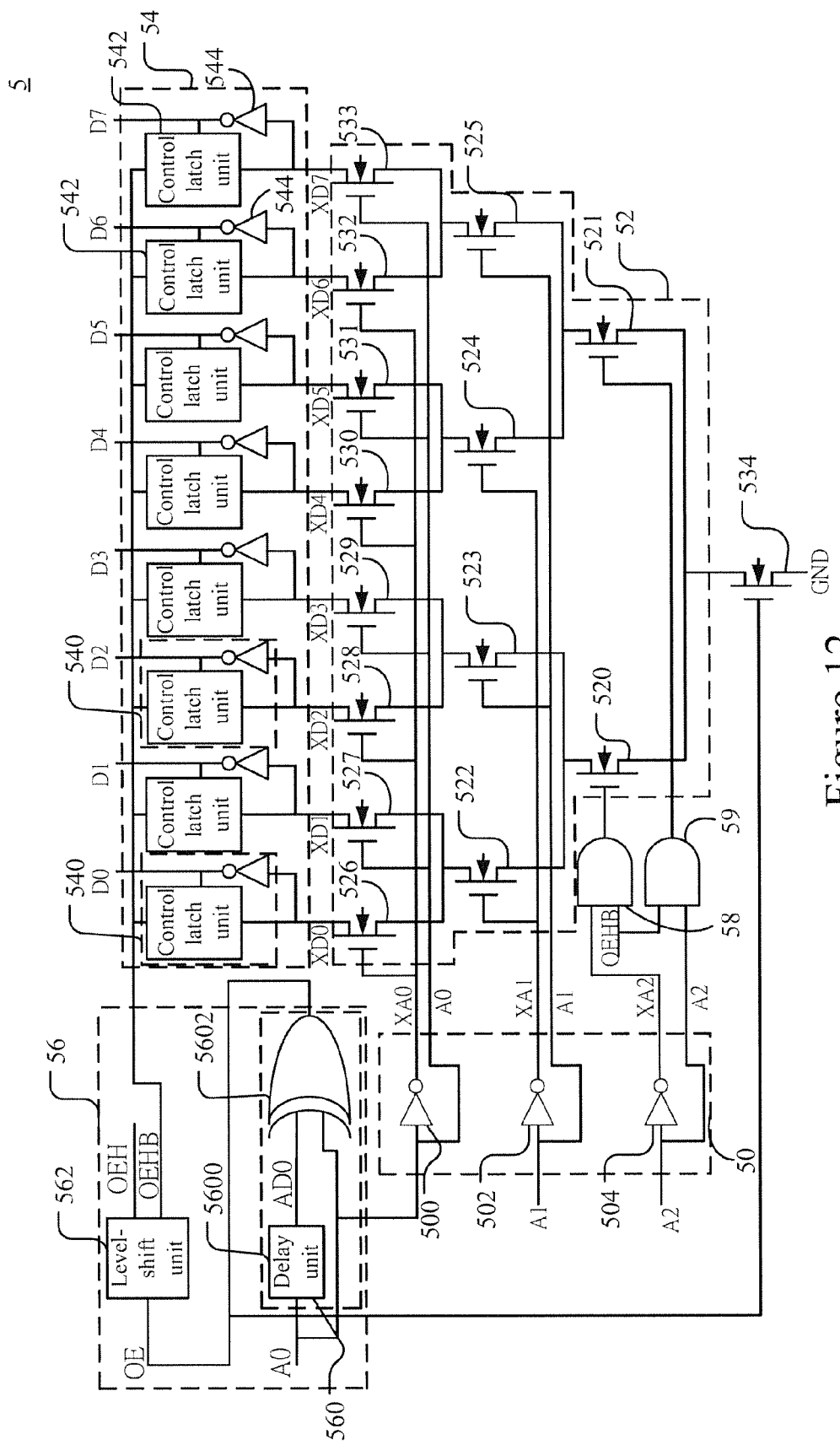
FIG. 12 shows a circuit diagram of the decoding and scan driver according the fifth embodiment of the present invention.

FIG. 12 shows a circuit diagram of the decoding and scan driver according the fifth embodiment of the present invention. As shown in the figure, the difference between the decoding and scan driver 5 according to the present embodiment and the one in FIG. 10 is that the decoding circuit 52 of the decoding and scan driver 5 according to the present embodiment further includes a fifteenth switch 534. A first terminal of the fifteenth switch 534 is coupled to the first terminal of the first switch 520 and the first terminal of the second switch 521. Besides, a second terminal of the fifteenth switch is coupled to the ground GND.

Figure 13:
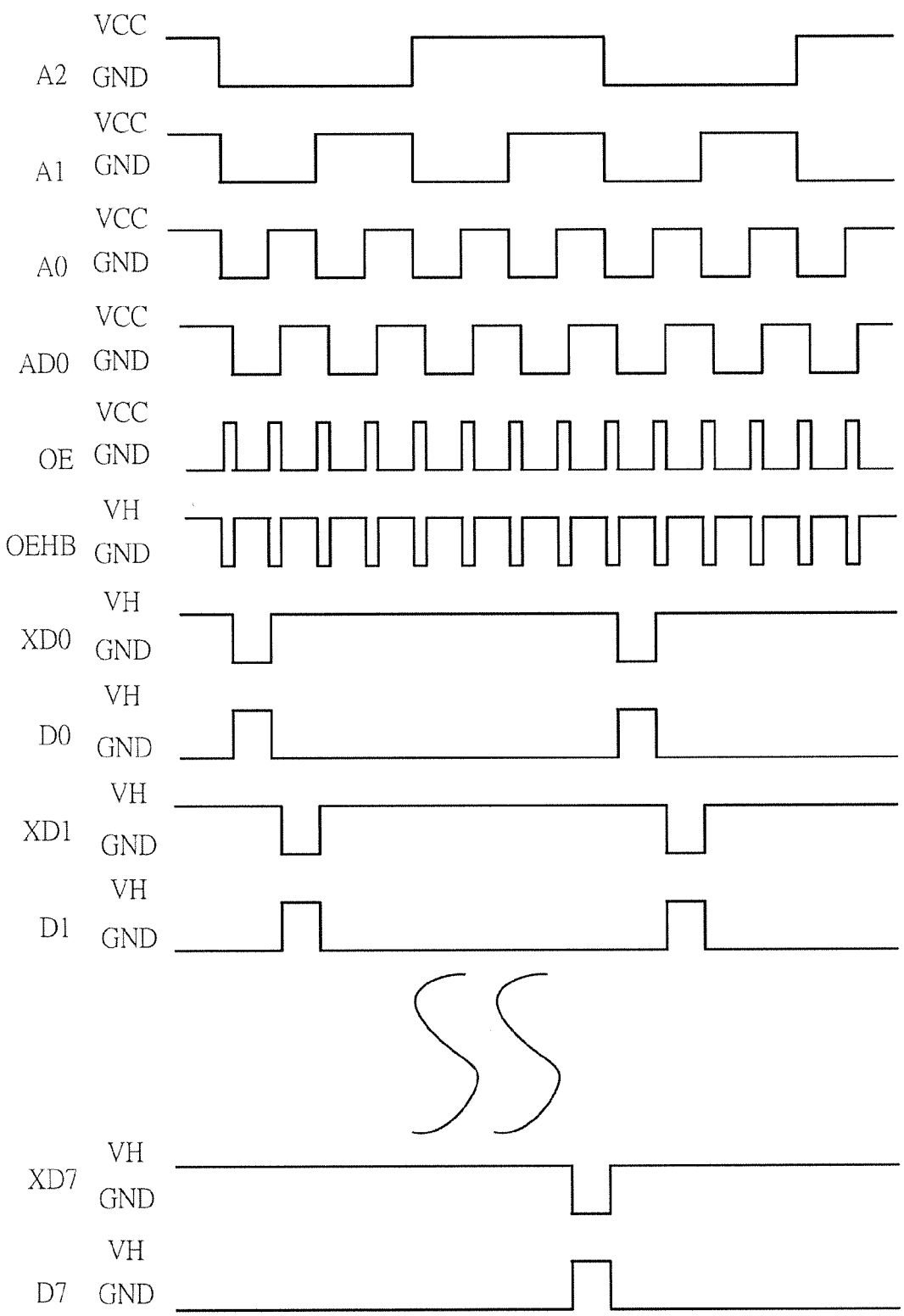
FIG. 13 shows timing diagrams of the decoding and scan driver according to the present invention in FIG. 10 and FIG. 12.

FIG. 13 shows timing diagrams of the decoding and scan driver according to the present invention in FIG. 10 and FIG. 12. As shown in the figure, the timing diagrams according to the present embodiment are similar to those according to the embodiment in FIG. 3. Hence, the details will not be described again.

Figure 14:
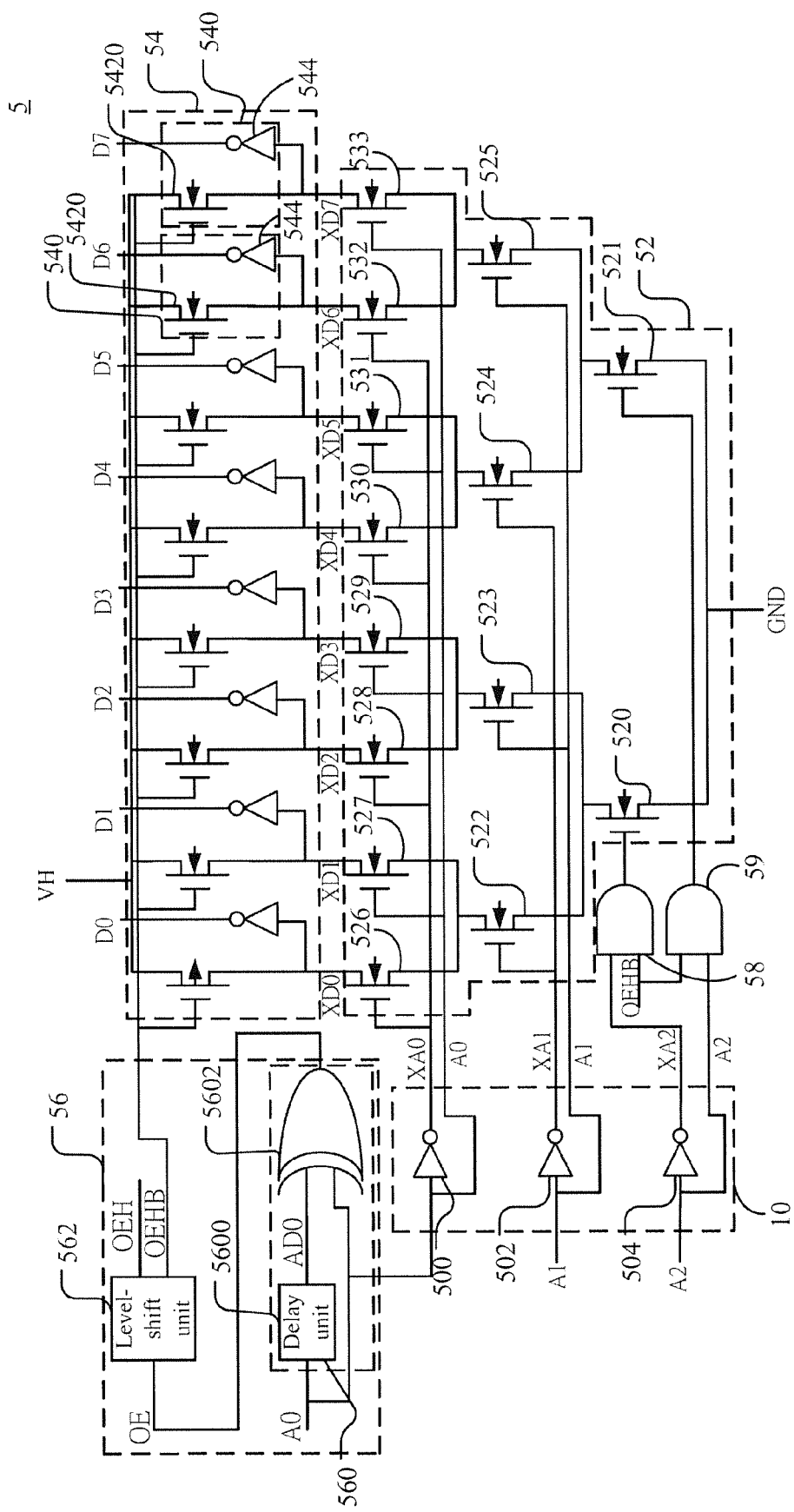
FIG. 14 shows a circuit diagram of the decoding and scan driver according the sixth embodiment of the present invention.

FIG. 14 shows a circuit diagram of the decoding and scan driver according the sixth embodiment of the present invention. As shown in the figure, the difference between the decoding and scan driver 5 according to the present embodiment and the one in FIG. 12 is that each control latch unit 542 in the output driving circuit 54 of the decoding and scan driver 5 according to the present embodiment includes only one first transistor 5420. The first terminals of the first transistors 5420 are coupled together. The second terminal of each first transistor 5420 is coupled to the first terminal of the inverter 544, as described in the description for FIG. 4. The details will not be described again.

Besides, the decoding and scan driver 5 according to the present embodiment shifts the input voltage to the positive voltage VH. Because a terminal of the first transistor 5420 receives the positive voltage VH while the other terminal thereof is coupled to the inverter 544, when the decoding circuit 52 needs to output, the first transistor 5420 is turned on for making the inverter 544 shift the input voltage to the positive voltage VH. For example, the inverter can shift the voltage 1.8V to the positive voltage 5V. Thereby, when the decoding and scan driver 5 is applied to middle or low voltage levels, no level-shift circuit is required for achieving the purpose of saving circuit area. The positive voltage VH can be greater than, smaller than, or equal to the power supply Vcc. However, the positive voltage VH is greater than the ground GND.

Figure 15:
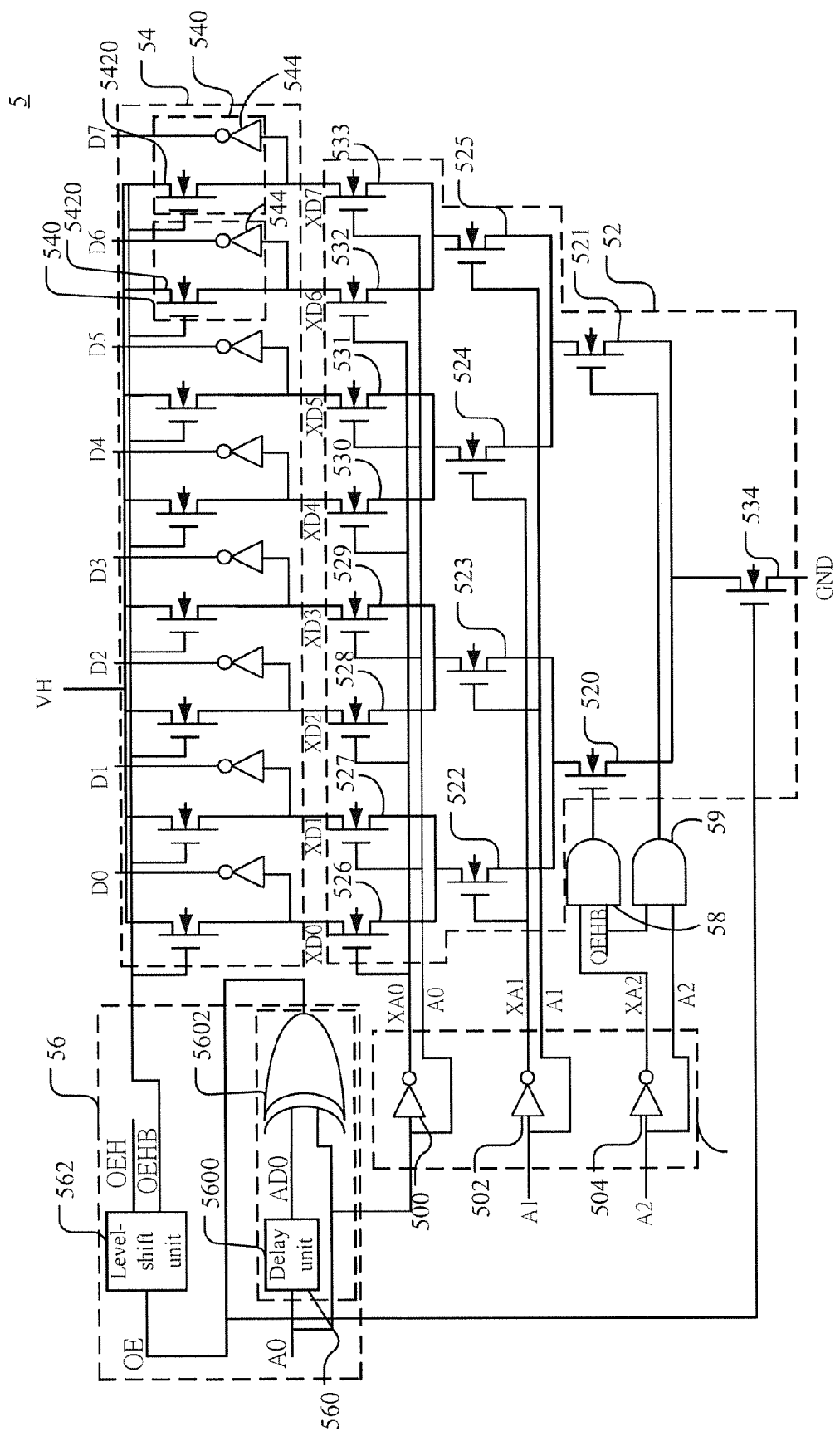
FIG. 15 shows a circuit diagram of the decoding and scan driver according the seventh embodiment of the present invention.

FIG. 15 shows a circuit diagram of the decoding and scan driver according the seventh embodiment of the present invention. As shown in the figure, the difference between the present embodiment and the sixth embodiment is that the decoding circuit 52 according to the present embodiment further includes the fifteenth switch 534. The fifteenth switch 534 has been described in the description for FIG. 12. Hence, the details will not be repeated here.

Figure 16:
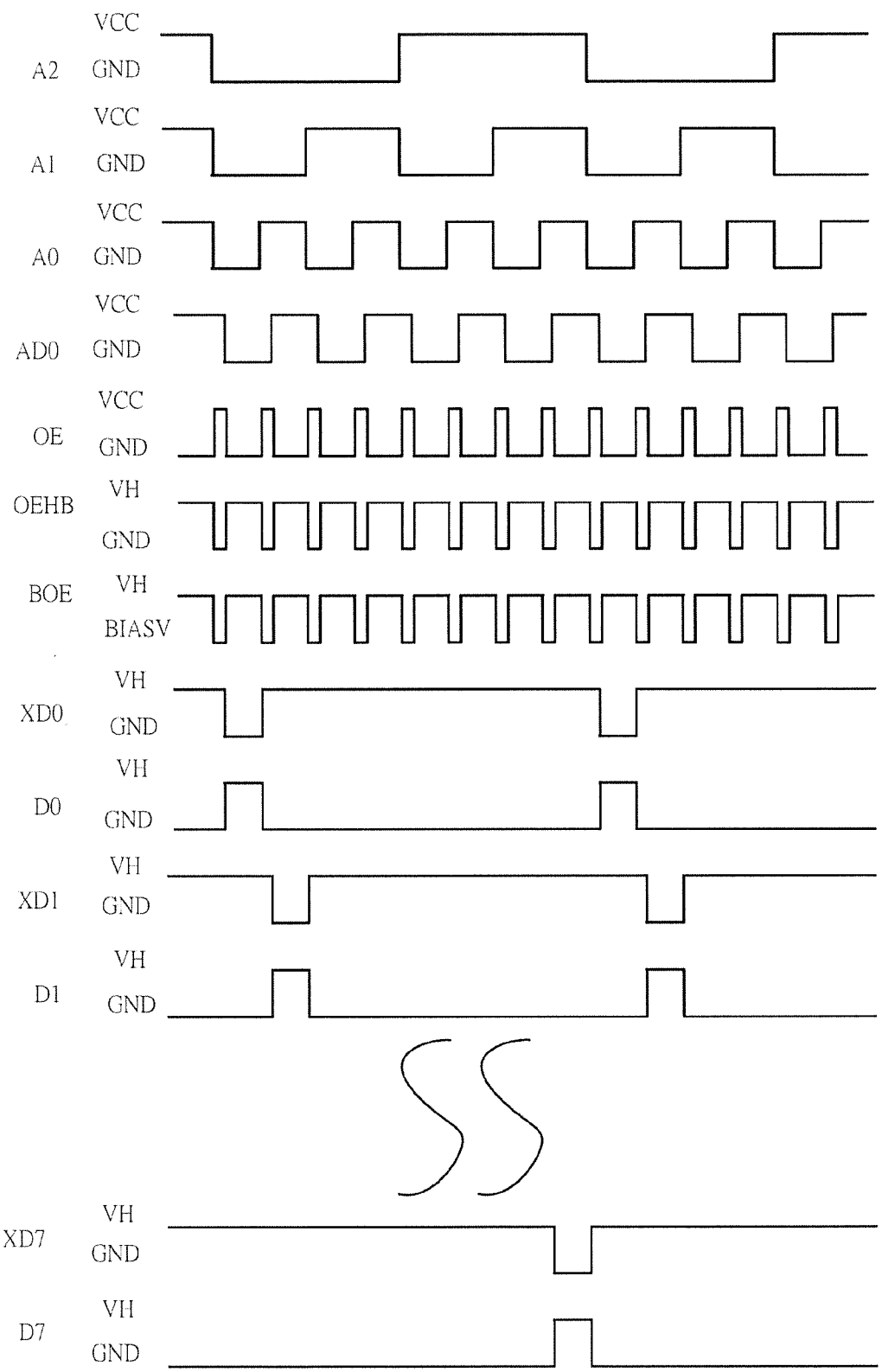
FIG. 16 shows timing diagrams of the decoding and scan driver according to the present invention in FIG. 14 and FIG. 15.

FIG. 16 shows timing diagrams of the decoding and scan driver according to the present invention in FIG. 14 and FIG. 15. As shown in the figure, the timing diagrams according to the present embodiment are similar to those according to the embodiment in FIG. 6. Hence, the details will not be described again.

Figure 17:
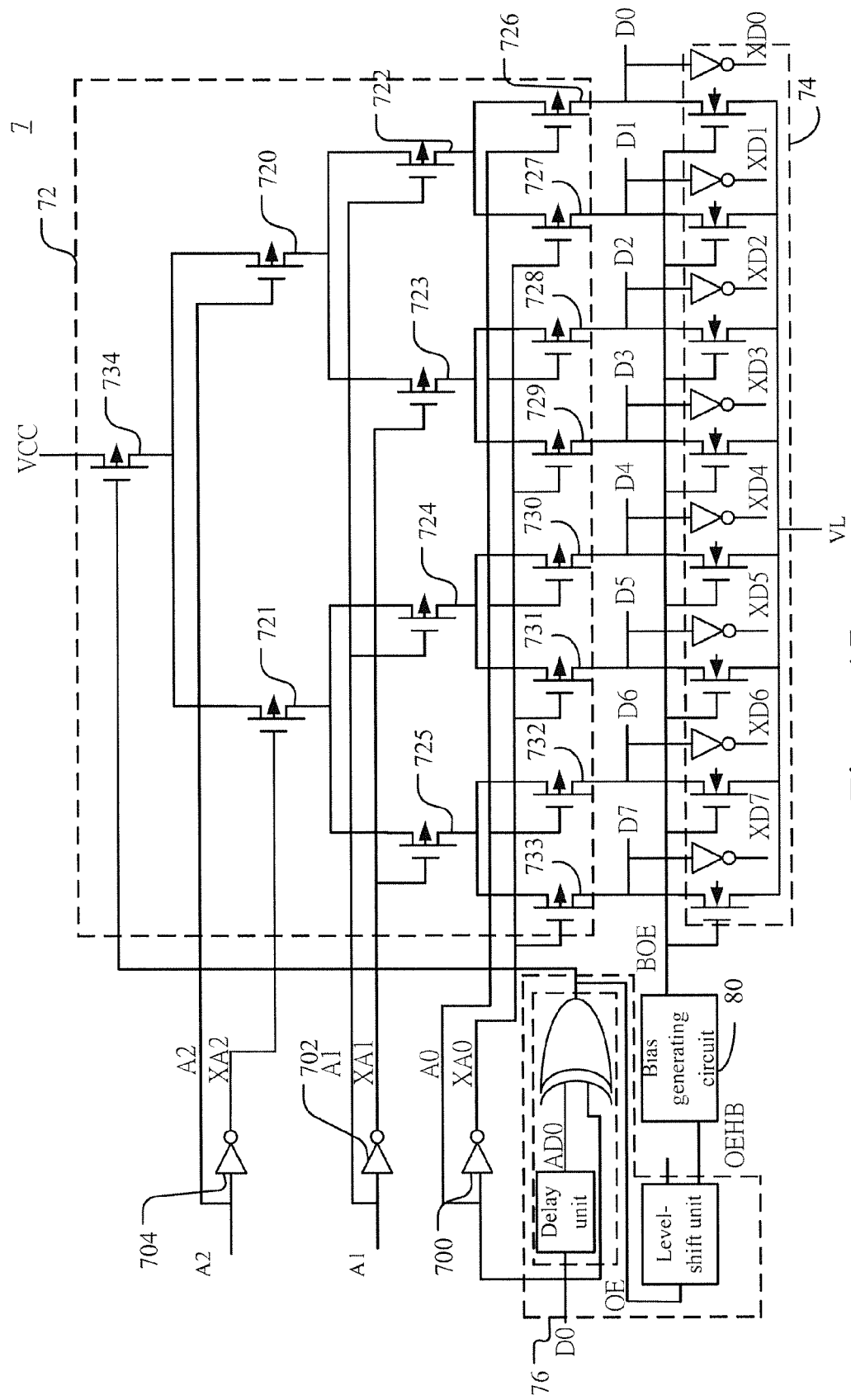
FIG. 17 shows a circuit diagram of the decoding and scan driver according the eighth embodiment of the present invention.

FIG. 17 shows a circuit diagram of the decoding and scan driver according the eighth embodiment of the present invention. As shown in the figure, the difference between the present embodiment and the one in FIG. 12 is that the level-shift decoding and scan driver according to the present embodiment shifts a positive voltage to a negative voltage VL for outputting. For example, the input is 0 to 1.8V, while the output is 1.8V to −5V. A plurality of switches in a decoding circuit 72 of the level-shift decoding and scan driver with the negative voltage VL smaller than the power supply Vcc are p-type field-effect transistors. The decoding circuit 72 comprises a first switch 720, a second switch 721, a third switch 722, a fourth switch 723, a fifth switch 724, a sixth switch 725, a seventh switch 726, a eighth switch 727, a ninth switch 728, a tenth switch 729, an eleventh switch 730, a twelfth switch 731, a thirteenth switch 732, a fourteenth switch 733, and a fifteenth switch 734. The first to the fifteenth switches 720~734 are n-type field effect transistors. Because the first to the fifteenth switches 720~734 are identical to the first to the fifteenth switches 320~334 of the decoding circuit 32 in FIG. 7, the details will not be described further.

According to the present embodiment, the input voltage is shifted to the negative voltage VL with the shifting principle the same as what described in FIG. 11. Thanks to the power supply VL, which is smaller than the general power supply Vcc, of the inverter 744, the inverter 744 can shift the voltage level to the power supply VL. For example, the inverter 744 can shift the voltage 1.8V to −5V. Thereby, when the decoding and scan driver 7 is applied to middle or low voltage levels, the decoding and scan driver 7 needs not to use any level-shift circuit, and thus saving the circuit area.

Figure 18:
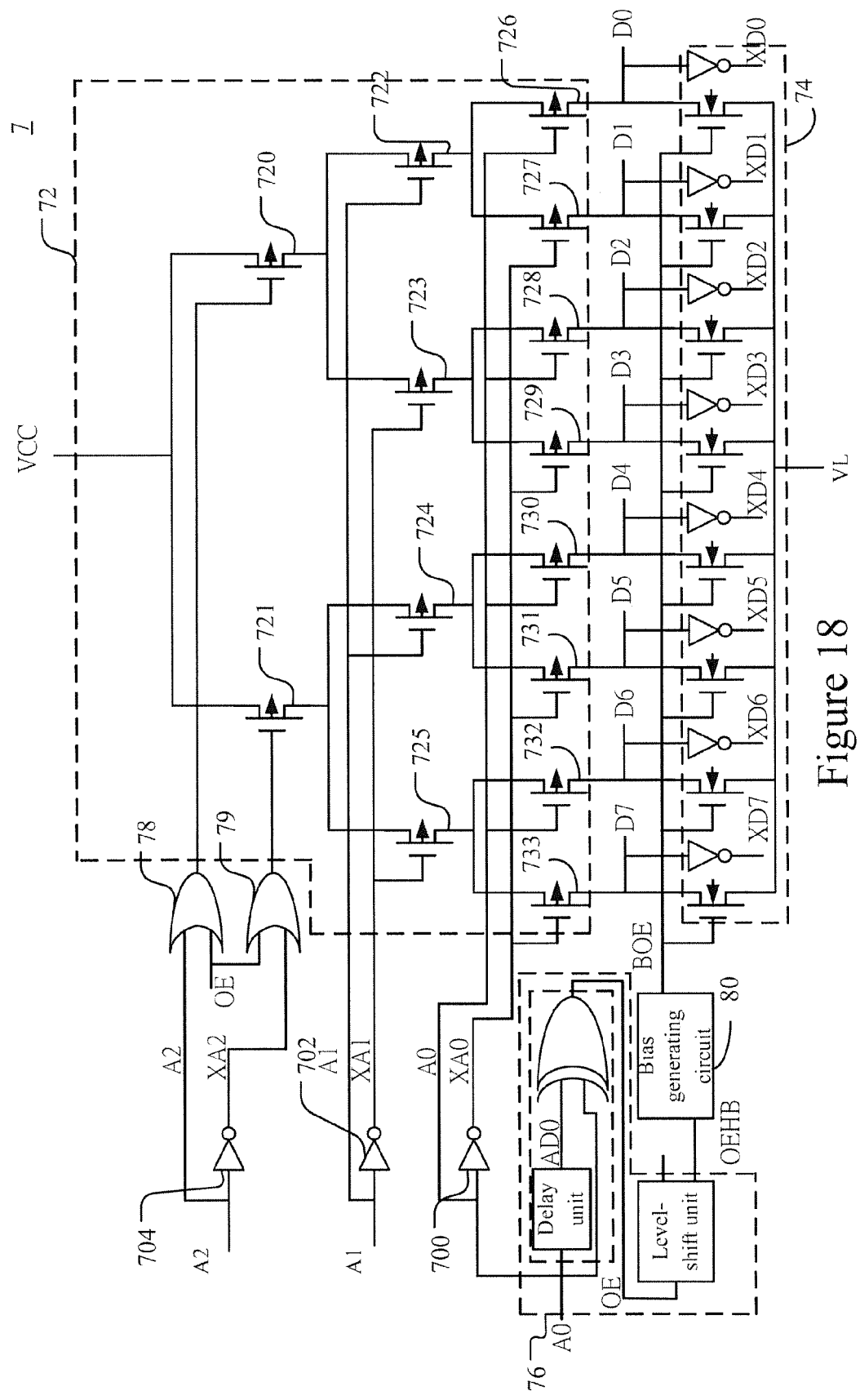
FIG. 18 shows a circuit diagram of the decoding and scan driver according the ninth embodiment of the present invention.

FIG. 18 shows a circuit diagram of the decoding and scan driver according the ninth embodiment of the present invention. As shown in the figure, the difference between the present embodiment and the one in FIG. 17 is that the decoding and scan driver 7 according to the present embodiment further comprises a third logic unit 78 and a fourth logic unit 79. A first input of the third logic unit 78 receives the input signal A2; a second input of the third logic unit 78 receives an enable signal OE of an enable circuit 760 of a control circuit 76. Besides, an output of the third logic unit 78 is coupled to the first switch 720 of the decoding circuit 72. A first input of the fourth logic unit 79 is coupled to a third inverse input signal XA2 output by the inverter 704. A second input of the fourth logic unit 79 receives the enable signal OE of the enable circuit 760 of the control circuit 76. The output of the fourth logic unit 79 is coupled to the second switch 721 of the decoding circuit 72. The third and the fourth logic units 78, 79 are OR gates. By using the third and the fourth logic units 78, 79 according to the present invention, large transient currents can be avoided.

Figure 19:
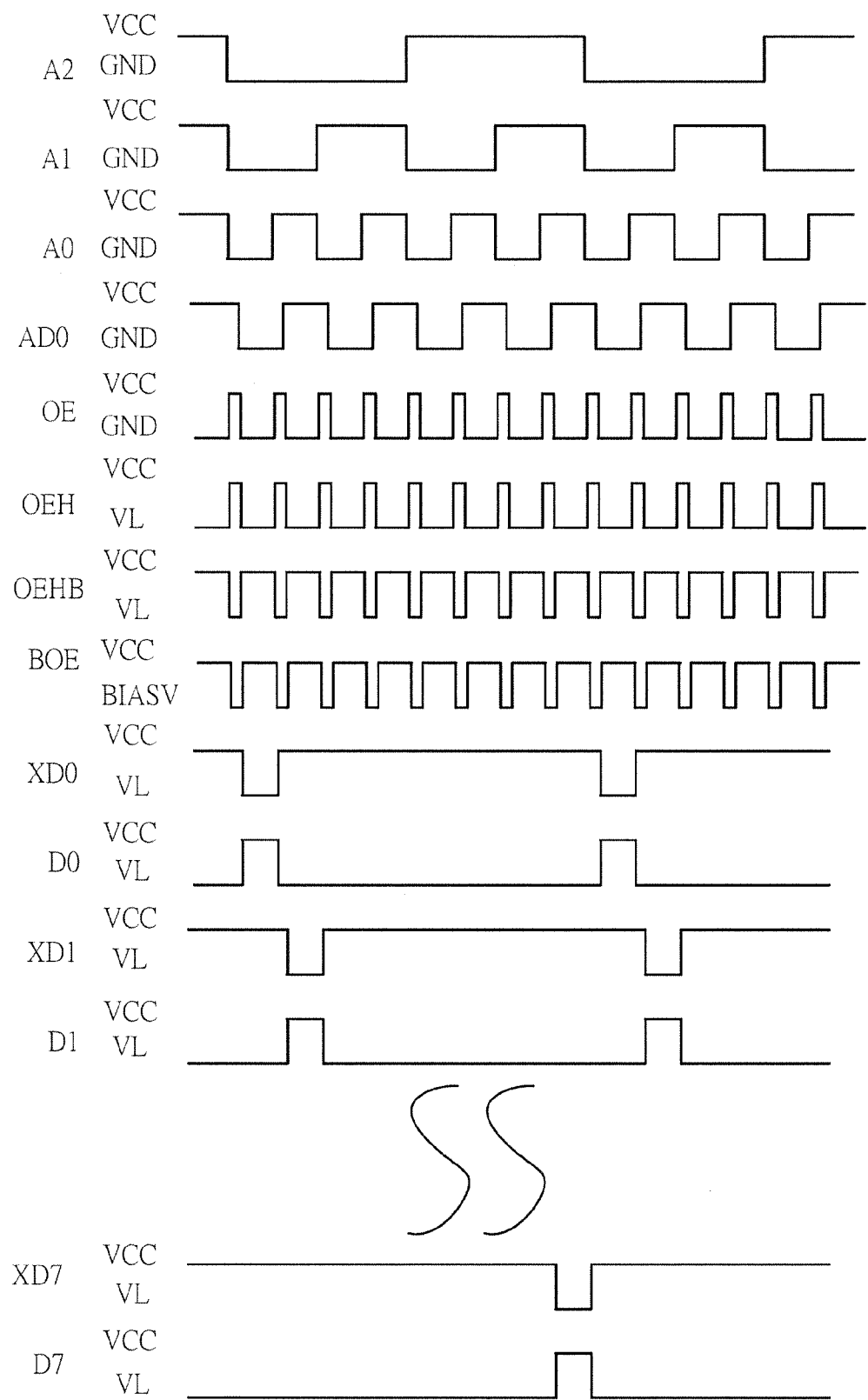
FIG. 19 shows timing diagrams of the decoding and scan driver according to the present invention in FIG. 17 and FIG. 18.

FIG. 19 shows timing diagrams of the decoding and scan driver according to the present invention in FIG. 17 and FIG. 18. As shown in the figure, the timing diagrams according to the present embodiment are similar to those according to the embodiment in FIG. 9. Hence, the details will not be described further.

Figure 20:
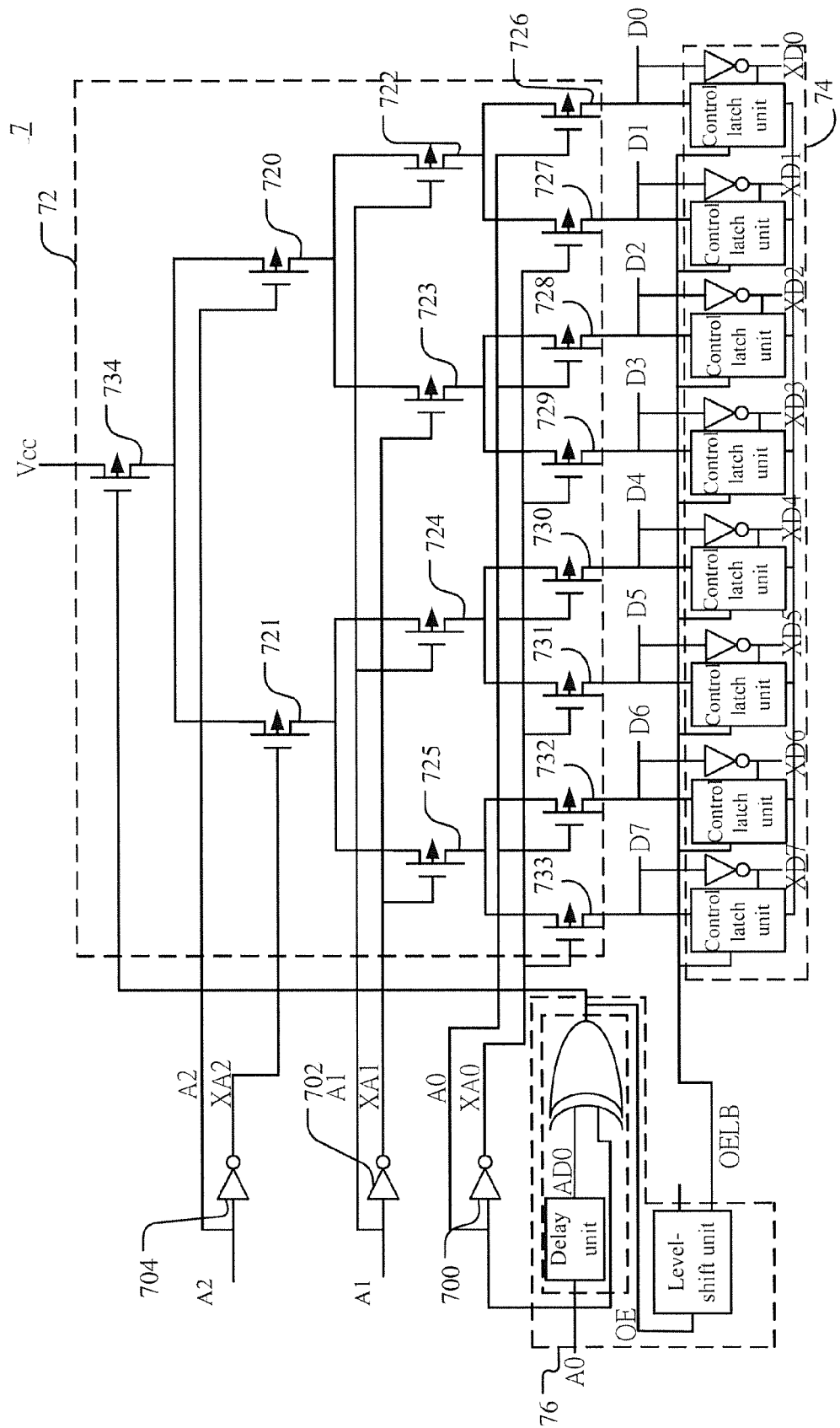
FIG. 20 shows a circuit diagram of the decoding and scan driver according the tenth embodiment of the present invention.

FIG. 20 shows a circuit diagram of the decoding and scan driver according the tenth embodiment of the present invention. As shown in the figure, the difference between the present embodiment and the one in FIG. 17 is that each control latch unit 742 in the output driving circuit 74 of the decoding and scan driver 7 according to the present embodiment includes two transistors, as the first and the second transistors 1420, 1422 of the control latch unit 142 described in FIG. 2. Hence, the details will not be described again.

Figure 21:
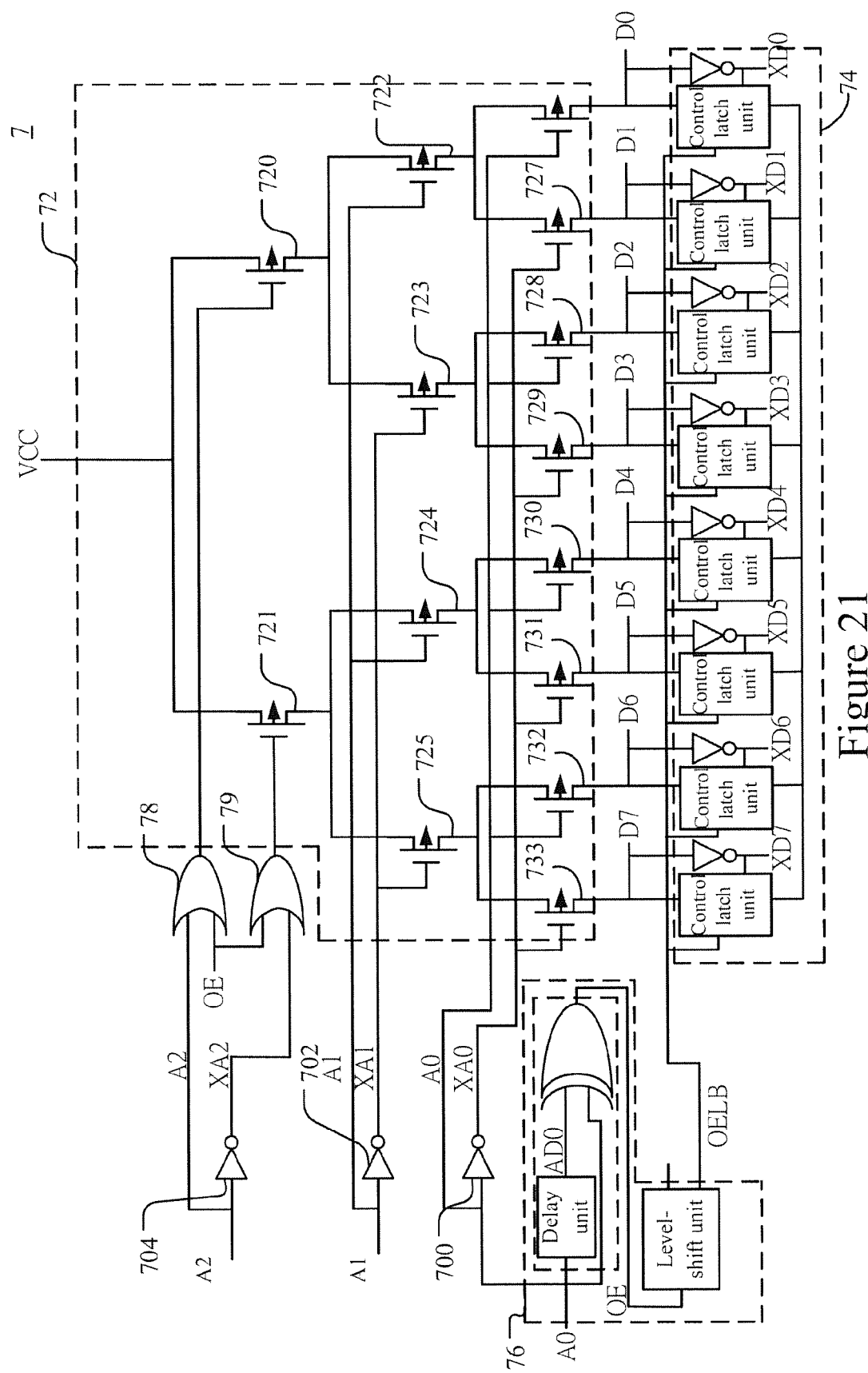
FIG. 21 shows a circuit diagram of the decoding and scan driver according the eleventh embodiment of the present invention.

FIG. 21 shows a circuit diagram of the decoding and scan driver according the eleventh embodiment of the present invention. As shown in the figure, the difference between the decoding and scan driver according to the present embodiment and the one according to the embodiment in FIG. 20 is that the decoding circuit 72 according to the present embodiment further includes the fifteenth switch 734. The fifteenth switch 734 has been described in the description for FIG. 12. Hence, the details will not be repeated here.

Figure 22:
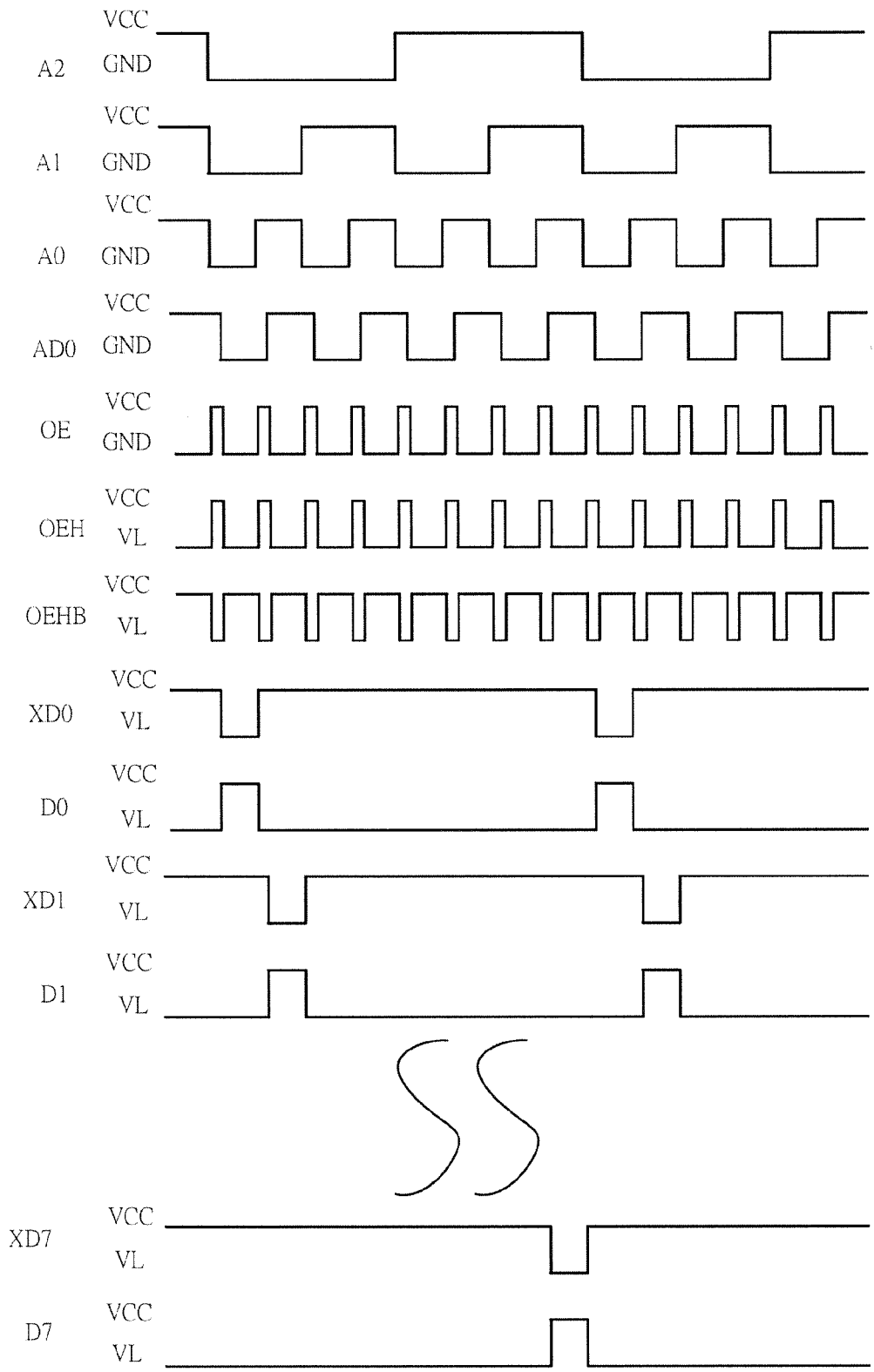
FIG. 22 shows timing diagrams of the decoding and scan driver according to the present invention in FIG. 20 and FIG. 21.

FIG. 22 shows timing diagrams of the decoding and scan driver according to the present invention in FIG. 20 and FIG. 21. As shown in the figure, the timing diagrams according to the present embodiment are similar to those according to the embodiment in FIG. 9. Hence, the details will not be described further.

To sum up, the decoding and scan driver according to the present invention comprises a level-shift circuit, a decoding circuit, an output driving circuit, and a control circuit. The level-shift circuit receives a plurality of input signals and shifts the voltage levels of the plurality of input signals for producing a plurality of decoding control signals. The decoding circuit is coupled to the level-shift circuit and produces a plurality of decoding signals according to the plurality of decoding control signals. The output driving circuit is coupled to the decoding circuit, produces a driving signal sequentially according to the plurality of decoding signals, and outputs the driving signal for driving a display panel. The control circuit is coupled to the output driving circuit, produces a control signal according to one of the plurality of input signals, and transmits the control signal to the output driving circuit for controlling the output driving circuit to output the driving signal. Thereby, the circuit area of the decoding and scan driver is saved and the cost is thus reduced.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A decoding and scan driver, comprising:
    a level-shift circuit, receiving a plurality of input signals, shifting a plurality of voltage levels of said plurality of input signals, and producing a plurality of decoding control signals;
    a decoding circuit, coupled to said level-shift circuit, producing a plurality of decoding signals according to said plurality of decoding control signals;
    an output driving circuit, coupled to said decoding circuit, producing a driving signal sequentially according to said plurality of decoding signals, and outputting said driving signal for driving a display panel;
    a control circuit, coupled to said output driving circuit, producing a control signal according to one of said plurality of input signals, and transmitting said control signal to said output driving circuit for controlling said output driving circuit to output said driving signal;
    a first logic unit, having a first input, a second input, and an output, said first input of said first logic unit coupled to said level-shift circuit, said second input of said first logic unit receiving said control signal, and said output of said first logic unit coupled to said decoding circuit; and
    a second logic unit, having a first input, a second input, and an output, said first input of said second logic unit coupled to said level-shift circuit, said second input of said second logic unit receiving said control signal, and said output of said second logic unit coupled to said decoding circuit.

2. The decoding and scan driver of claim 1, wherein said control circuit produces said control signal according to a least significant bit of said plurality of input signals.

3. The decoding and scan driver of claim 1, wherein said control circuit comprises:
    an enable circuit, receiving said input signal and producing an enable signal according to said input signal; and
    a level-shift unit, coupled to said enable circuit, and shifting the voltage level of said enable signal for producing said control signal.

4. The decoding and scan driver of claim 3, wherein said control circuit further comprises a bias generating circuit coupled to said level-shift unit, and producing said control signal according to an output signal of said level-shift unit.

5. The decoding and scan driver of claim 1, wherein said output driving circuit comprises a plurality of output driving units with each output driving unit including:
    a control latch unit, coupled to said control circuit and said decoding circuit, and controlled by said control signal and said driving signal; and
    an inverter, having a first terminal and a second terminal, said first terminal of said inverter coupled to said decoding circuit, and said second terminal of said inverter coupled to said control latch unit.

6. The decoding and scan driver of claim 5, wherein said control latch unit includes:
    a first transistor, having a first terminal coupled to a power supply, having a second terminal coupled to said decoding circuit and said first terminal of said inverter, and controlled by said control signal; and a second transistor, having a first terminal coupled to said power supply, having a second terminal coupled to said second terminal of said first transistor, said decoding circuit, and said first terminal of said inverter, and controlled by said driving signal.

7. The decoding and scan driver of claim 5, wherein said control latch unit includes a transistor, having a first terminal coupled to a power supply, and having a second terminal coupled to said decoding circuit and said first terminal of said inverter.

8. A decoding and scan driver, comprising:
a level-shift circuit, receiving a plurality of input signals, shifting a plurality of voltage levels of said plurality of input signals, and producing a plurality of decoding control signals;
a decoding circuit, coupled to said level-shift circuit, producing a plurality of decoding signals according to said plurality of decoding control signals;
an output driving circuit, coupled to said decoding circuit, producing a driving signal sequentially according to said plurality of decoding signals, and outputting said driving signal for driving a display panel;
a control circuit, coupled to said output driving circuit and said decoding circuit, producing a control signal according to one of said plurality of input signals, and transmitting said control signal to said output driving circuit for controlling said output driving circuit to output said driving signal, and said control signal controlling the decoding circuit to output said decoding signals;
a first logic unit, having a first input, a second input, and an output, said first input of said first logic unit coupled to said level-shift circuit, said second input of said first logic unit receiving said control signal, and said output of said first logic unit coupled to said decoding circuit; and
a second logic unit, having a first input, a second input, and an output, said first input of said second logic unit coupled to said level-shift circuit, said second input of said second logic unit receiving said control signal, and said output of said second logic unit coupled to said decoding circuit.

9. The decoding and scan driver of claim 8, wherein said control circuit produces said control signal according to a least significant bit of said plurality of input signals.

10. The decoding and scan driver of claim 8, wherein said control circuit comprises:
an enable circuit, receiving said input signal and producing an enable signal according to said input signal;
a level-shift unit, coupled to said enable circuit, and shifting the voltage level of said enable signal for producing said control signal; and
a bias generating circuit, coupled to said level-shift unit, and producing said control signal according to an output signal of said level-shift unit.

11. The decoding and scan driver of claim 8, wherein said output driving circuit includes a transistor, having a first terminal coupled to said decoding circuit and an output of said output driving circuit, and controlled by said control signal.

12. A decoding and scan driver, comprising:
a decoding circuit, receiving a plurality of input signals, and producing a plurality of decoding signals according to said plurality of input signals;
an output driving circuit, coupled to said decoding circuit, receiving a positive voltage, producing a high-level driving signal sequentially according to said plurality of decoding signals and said positive voltage, outputting said driving signal for driving a display panel, and the voltage of said driving signal greater than the voltages of said plurality of input signals;
a control circuit, coupled to said output driving circuit, producing a control signal according to one of said plurality of input signals, and transmitting said control signal to said output driving circuit for controlling said output driving circuit to output said driving signal;
a first logic unit, having a first input, a second input, and an output, said first input of said first logic unit coupled to one of said plurality of input signals, said second input of said first logic unit receiving said control signal, and said output of said first logic unit coupled to said decoding circuit; and
a second logic unit, having a first input, a second input, and an output, said first input of said second logic unit coupled to one of said plurality of input signals, said second input of said second logic unit receiving said control signal, and said output of said second logic unit coupled to said decoding circuit.

13. The decoding and scan driver of claim 12, wherein said control circuit produces said control signal according to the least significant bit of said plurality of input signals.

14. The decoding and scan driver of claim 12, wherein said output driving circuit comprises a plurality of output driving units with each output driving unit including:
a control latch unit, coupled to said control circuit and said decoding circuit, and controlled by said control signal and said driving signal; and
an inverter, having a first terminal and a second terminal, said first terminal of said inverter coupled to said decoding circuit, and said second terminal of said inverter coupled to said control latch unit.

15. A decoding and scan driver, comprising:
a decoding circuit, receiving a plurality of input signals, and producing a plurality of decoding signals according to said plurality of input signals;
an output driving circuit, coupled to said decoding circuit, receiving a negative voltage, producing a low-level driving signal sequentially according to said plurality of decoding signals and said negative voltage, outputting said driving signal for driving a display panel, and the voltage of said driving signal smaller than the voltages of said plurality of input signals; and
a control circuit, coupled to said output driving circuit, producing a control signal according to one of said plurality of input signals, and transmitting said control signal to said output driving circuit for controlling said output driving circuit to output said driving signal;
a first logic unit, having a first input, a second input, and an output, said first input of said first logic unit coupled to one of said plurality of input signals, said second input of said first logic unit receiving said control signal, and said output of said first logic unit coupled to said decoding circuit; and
a second logic unit, having a first input, a second input, and an output, said first input of said second logic unit coupled to one of said plurality of input signals, said second input of said second logic unit receiving said control signal, and said output of said second logic unit coupled to said decoding circuit.

16. The decoding and scan driver of claim 15, wherein said control circuit produces said control signal according to the least significant bit of said plurality of input signals.

17. The decoding and scan driver of claim 15, wherein said output driving circuit comprises a plurality of output driving units with each output driving unit including:
- a control latch unit, coupled to said control circuit and said decoding circuit, and controlled by said control signal and said driving signal; and
- an inverter, having a first terminal and a second terminal, said first terminal of said inverter coupled to said decoding circuit, and said second terminal of said inverter coupled to said control latch unit.

* * * * *